(12) United States Patent
Komori et al.

(10) Patent No.: US 11,512,199 B2
(45) Date of Patent: Nov. 29, 2022

(54) RESIN COMPOSITION, RESIN SHEET, CURED FILM, ORGANIC EL DISPLAY DEVICE, SEMICONDUCTOR ELECTRONIC COMPONENT, SEMICONDUCTOR EQUIPMENT, AND METHOD FOR PRODUCING ORGANIC EL DISPLAY DEVICE

(71) Applicant: TORAY INDUSTRIES, INC., Tokyo (JP)

(72) Inventors: Yusuke Komori, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 878 days.

(21) Appl. No.: 16/338,876

(22) PCT Filed: Oct. 31, 2017

(86) PCT No.: PCT/JP2017/039352
§ 371 (c)(1),
(2) Date: Apr. 2, 2019

(87) PCT Pub. No.: WO2018/084149
PCT Pub. Date: May 11, 2018

(65) Prior Publication Data
US 2021/0284839 A1     Sep. 16, 2021

(30) Foreign Application Priority Data

Nov. 2, 2016  (JP) ................................ 2016-214777

(51) Int. Cl.
*C08L 79/08* (2006.01)
*C08G 73/06* (2006.01)
(Continued)

(52) U.S. Cl.
CPC .............. *C08L 79/08* (2013.01); *C08G 73/06* (2013.01); *G03F 7/0387* (2013.01);
(Continued)

(58) Field of Classification Search
CPC ........ C08G 14/04; C08G 14/00; C08G 14/12; C08G 73/22; C08G 73/06; C08L 79/04;
(Continued)

(56) References Cited

U.S. PATENT DOCUMENTS 5,543,516 A * 8/1996 Ishida .................. C08G 77/382
544/69
2007/0218400 A1 9/2007 Kawasaki
(Continued)

FOREIGN PATENT DOCUMENTS

JP     2001-181249 A     7/2001
JP     2007-286603 A     11/2007
(Continued)

OTHER PUBLICATIONS

International Search Report (PCT/ISA/210) issued in PCT/JP2017/039352, dated Jan. 23, 2018.
(Continued)

*Primary Examiner* — Shane Fang
(74) *Attorney, Agent, or Firm* — Birch, Stewart, Kolasch & Birch, LLP

(57) ABSTRACT

The present invention provides a resin composition which is highly sensitive and exhibits high chemical resistance even in the case of being baked at a low temperature of 250° C. or less and can suppress the generation of outgas after curing. The present invention is a resin composition which contains (a) an alkali-soluble resin containing polyimide, polybenzoxazole, polyamide-imide, a precursor of any one of these compounds and/or a copolymer of these compounds (Continued)

and (b) an alkali-soluble resin having a monovalent or divalent group represented by the following general formula (1) in a structural unit and in which the modification rate of a phenolic hydroxyl group in the alkali-soluble resin (b) is 5% to 50%.

[Chem. 1]

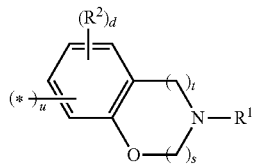

(1)

(In general formula (1), O represents an oxygen atom. $R^1$ represents a hydrogen atom or a hydrocarbon group which has 1 to 20 carbon atoms and may be substituted and $R^2$ represents an alkyl group having 1 to 5 carbon atoms. s and t each independently represent an integer from 0 to 3. Provided that (s+t)≥1. d represents an integer from 0 to 2. u represents an integer from 1 to 2, and * represents a chemical bond.)

20 Claims, 3 Drawing Sheets

(51) Int. Cl.
  *G03F 7/038* (2006.01)
  *G03F 7/039* (2006.01)
  *G03F 7/20* (2006.01)
  *G03F 7/32* (2006.01)
  *G03F 7/40* (2006.01)

(52) U.S. Cl.
  CPC .......... *G03F 7/0392* (2013.01); *G03F 7/2004* (2013.01); *G03F 7/322* (2013.01); *G03F 7/40* (2013.01)

(58) Field of Classification Search
  CPC ...... C08L 79/08; G03F 7/0387; G03F 7/0392; G03F 7/2004; G03F 7/322; G03F 7/40
  See application file for complete search history.

(56) References Cited

U.S. PATENT DOCUMENTS

| 2010/0216070 A1 | 8/2010 | Yamanaka et al. |
| 2015/0212412 A1 | 7/2015 | Onishi |
| 2016/0040037 A1* | 2/2016 | Gorodisher .......... C09D 179/04 524/612 |
| 2017/0299965 A1 | 10/2017 | Hashimoto et al. |
| 2018/0342386 A1 | 11/2018 | Onishi et al. |

FOREIGN PATENT DOCUMENTS

| JP | 2009-068008 A | 4/2009 |
| JP | 2014-009321 A | 1/2014 |
| WO | WO 2014/050558 A1 | 4/2014 |
| WO | WO 2016/158150 A1 | 10/2016 |

OTHER PUBLICATIONS

Written Opinion (PCT/ISA/237) issued in PCT/JP2017/039352, dated Jan. 23, 2018.
Taiwanese Search Report for Taiwanese Application No. 106137705, dated Dec. 30, 2020.

* cited by examiner

RESIN COMPOSITION, RESIN SHEET, CURED FILM, ORGANIC EL DISPLAY DEVICE, SEMICONDUCTOR ELECTRONIC COMPONENT, SEMICONDUCTOR EQUIPMENT, AND METHOD FOR PRODUCING ORGANIC EL DISPLAY DEVICE

TECHNICAL FIELD

The present invention relates to a resin composition which contains an alkali-soluble resin containing polyimide, polybenzoxazole, polyamide-imide, a precursor of any one of these compounds and/or a copolymer of these compounds and an alkali-soluble resin having a benzoxazine structure.

BACKGROUND ART

Heat resistant resins such as polyimide, polybenzoxazole and polyamide-imide exhibit excellent heat resistance and electrical insulation properties, and thus photosensitive resin compositions containing these heat resistant resins are used in a surface protective layer of a semiconductor device such as LSI, an interlayer insulation layer, an insulation layer of an organic electric field device and an organic EL display device, a planarization layer of a TFT substrate for display device, or the like. In the case of obtaining heat resistant resin films by subjecting the coating films of the precursors of these heat resistant resins to thermal dehydration cyclization, it is usually required to conduct baking at a high temperature of around 350° C. However, for example, Magnetoresistive Random Access Memory (MRAM) which is promising as next-generation memory is weak for high temperature process, and thus heat resistant resins which can be cured by being baked at a low temperature of about 250° C. or less and can provide the performance comparable to that of conventional heat resistant resins baked at a high temperature are required as materials which can be used in these applications.

As heat resistant resin compositions capable of being cured at a low temperature, a photosensitive polyamide-imide resin composition containing an alkali aqueous solution-soluble polyamide-imide, a photoacid generator, a solvent, and a crosslinking agent is known (see, for example, Patent Document 1). However, these resin compositions have a problem of having a low transmittance of i-line (365 nm) of a mercury lamp and of being poorly sensitive.

As a method for increasing the sensitivity, a system in which a heat resistant resin or its precursor is mixed with a resin having a phenolic hydroxyl group, such as a novolac resin or a resol resin, has been studied, and for example, a positive photosensitive resin precursor composition containing a novolac resin, polyimide precursor, a naphthoquinone diazide compound, an alkoxymethyl group-containing compound, and a solvent has been proposed (see, for example, Patent Document 2). However, in a case in which a resin composition containing a resin having a phenolic hydroxyl group or a hydroxystyrene compound is baked particularly at a low temperature of 250° C. or less, curing of the film is likely to insufficiently proceed and there is a problem in the chemical resistance of the cured film. Hence, as a means to accelerate curing of the film at a low temperature and to obtain a cured film exhibiting excellent chemical resistance, a positive photosensitive resin composition containing an alkali-soluble phenolic resin, a polyamide resin having a phenolic hydroxyl group, a photosensitive diazoquinone compound, a polyfunctional methylol compound, and a solvent has been proposed (see, for example, Patent Document 3). However, in a case in which such a photosensitive resin composition is baked at a low temperature of 250° C. or less, there is a problem that outgas after curing increases by the unreacted crosslinkable group.

Hence, as a technique for decreasing gas generated at the time of curing, a thermosetting resin having a benzoxazine ring structure has been proposed (see, for example, Patent Document 4).

PRIOR ART DOCUMENTS

Patent Documents

Patent Document 1: Japanese Patent Laid-open Publication No. 2007-240554
Patent Document 2: Japanese Patent Laid-open Publication No. 2008-257210
Patent Document 3: Japanese Patent Laid-open Publication No. 2005-250160
Patent Document 4: Japanese Patent Laid-open Publication No. 2014-9321

SUMMARY OF THE INVENTION

Problems to be Solved by the Invention

By the thermosetting resin having a benzoxazine ring structure described in Patent Document 4, it is possible to decrease gas generated at the time of curing but there is a problem that outgas is generated after curing. Accordingly, an object of the present invention is to provide a resin composition which is highly sensitive and exhibits high chemical resistance even in the case of being baked at a low temperature of 250° C. or less and can suppress the generation of outgas after curing.

Solutions to the Problems

The present invention is a resin composition containing:
(a) an alkali-soluble resin (alkali-soluble resin (a)) containing polyimide, polybenzoxazole, polyamide-imide, a precursor of any one of these compounds and/or a copolymer of these compounds; and
(b) an alkali-soluble resin (alkali-soluble resin (b)) having a monovalent or divalent group represented by the following general formula (1) in a structural unit,
in which a modification rate of a phenolic hydroxyl group in the alkali-soluble resin (b) is 5% to 50%.

[Chem. 1]

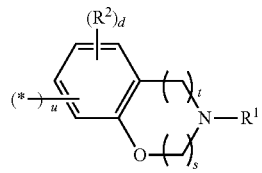

(1)

(In general formula (1), O represents an oxygen atom. $R^1$ represents a hydrogen atom or a hydrocarbon group which has 1 to 20 carbon atoms and may be substituted and $R^2$ represents an alkyl group having 1 to 5 carbon atoms. s and t each independently represent an integer from 0 to 3.

Provided that (s+t)≥1. d represents an integer from 0 to 2. u represents an integer from 1 to 2, and * represents a chemical bond.)

Effects of the Invention

The resin composition of the present invention is highly sensitive. According to the resin composition of the present invention, it is possible to obtain a cured film which exhibits high chemical resistance even in the case of being baked at a low temperature of 250° C. or less and generates less outgas.

EMBODIMENTS OF THE INVENTION

Figure 1:
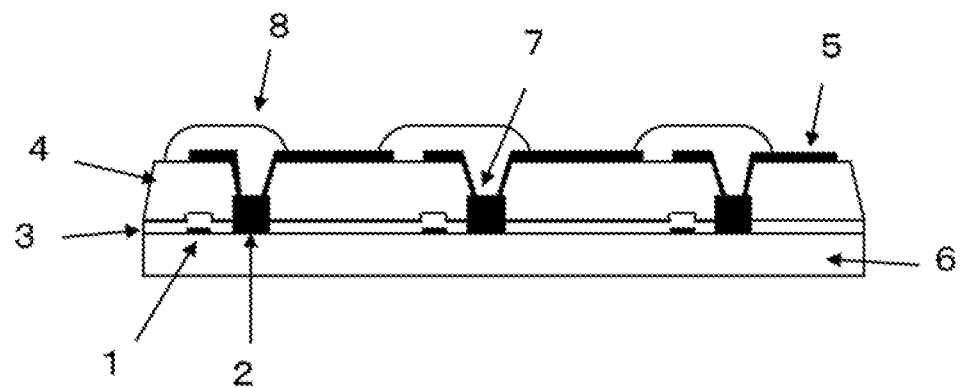
FIG. 1 is a cross-sectional view of an example of a TFT substrate.

Embodiments of the present invention will be described in detail.
<Alkali-Soluble Resin (a)>
The resin composition of the present invention contains an alkali-soluble resin (hereinafter simply referred to as "alkali-soluble resin (a)" in some cases) containing polyimide, polybenzoxazole, polyamide-imide, a precursor of any one of these compounds and/or a copolymer of these compounds. By containing the alkali-soluble resin (a), a resin composition exhibiting pattern processability and excellent heat resistance can be obtained. To be alkali-soluble in the present invention means that the dissolution rate determined from the decrease in film thickness is 50 nm/min or more when a solution obtained by dissolving a resin in γ-butyrolactone is applied on a silicon wafer and prebaked at 120° C. for 4 minutes to form a prebaked film having a film thickness of 10 μm±0.5 μm and the prebaked film is immersed in a 2.38 wt % tetramethylammonium hydroxide aqueous solution at 23° C.±1° C. for 1 minute and then rinsed with pure water.

It is preferable that the alkali-soluble resin (a) in the present invention has an acidic group in the structural unit of the resin and/or the main chain terminal thereof in order to impart alkali solubility to the resin. Examples of the acidic group include a carboxy group, a phenolic hydroxyl group, and a sulfonic acid group. In addition, it is preferable that the alkali-soluble resin (a) has a fluorine atom in order to impart water repellency to the resin.

As the alkali-soluble resin (a) in the present invention, polyimide, polyimide precursor, polybenzoxazole precursor, or a copolymer thereof is more preferable, and polyimide precursor or polybenzoxazole precursor is still more preferable from the viewpoint of further improving the sensitivity. Here, the polyimide precursor refers to a resin which is converted into polyimide by a heat treatment or a chemical treatment, and examples thereof include polyamic acid and a polyamic acid ester. The polybenzoxazole precursor refers to a resin which is converted into polybenzoxazole by a heat treatment or a chemical treatment, and examples thereof include polyhydroxyamide.

The polyimide describe above has a structural unit represented by the following general formula (6), and the polyimide precursor and the polybenzoxazole precursor have a structural unit represented by the following general formula (7). Two or more kinds of these may be contained, or a resin obtained by copolymerizing a structural unit represented by the general formula (6) and a structural unit represented by the general formula (7) may be used.

[Chem. 2]

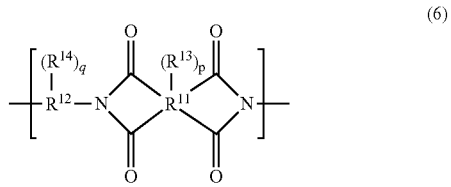

(In general formula (6), $R^{11}$ represents an organic group having a valence of 4 to 10, and $R^{12}$ represents an organic group having a valence of 2 to 8. $R^{13}$ and $R^{14}$ represent a carboxy group, a sulfonic acid group, or a phenolic hydroxyl group. p of $R^{13}$ may be the same as or different from one another, and q of $R^{14}$ may be the same as or different from one another. p and q represent an integer from 0 to 6.

[Chem. 3]

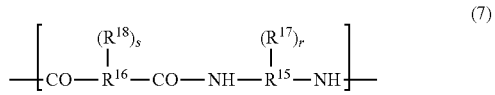

In general formula (7), $R^{15}$ and $R^{16}$ each represent an organic group having a valence of 2 to 8. $R^{17}$ and $R^{18}$ each represent a phenolic hydroxyl group, a sulfonic acid group, or $COOR^{19}$, and each of these may be a single group or a mixture of different groups. $R^{19}$ represents a hydrogen atom or a monovalent hydrocarbon group having 1 to 20 carbon atoms. r and s represent an integer from 0 to 6. Provided that r+s>0.

It is preferable that the polyimide, the polyimide precursor, the polybenzoxazole precursor, or a copolymer thereof has 5 to 100,000 of a structural unit represented by the general formula (6) or (7). In addition, the polyimide, the polyimide precursor, the polybenzoxazole precursor, or a copolymer thereof may have another structural unit in addition to the structural unit represented by the general formula (6) or (7). In this case, it is preferable that the structural unit represented by the general formula (6) or (7) take 50 mol % or more of the whole structural units.

In the general formula (6), $R^{11}$—$(R^{13})_p$ represents a residue of an acid dianhydride. $R^{11}$ is an organic group having a valence of 4 to 10, and among these, an organic group having 5 to 40 carbon atoms and containing an aromatic ring or a cyclic aliphatic group is preferable.

Specific examples of the acid dianhydride may include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl) ether dianhydride, 1,2,5,6-naphthalenetetracarboxylic dianhydride, 9,9-bis(3,4-dicarboxyphenyl)fluorenic dianhydride, 9,9-bis{4-(3,4-dicarboxyphenoxy)phenyl}fluorenic dianhydride, 2,3,6,7-naphthalenetetracarboxylic dianhydride, 2,3,5,6-pyridine tetracarboxylic dianhydride, 3,4,9,10-perylenetetracarboxylic dianhydride, 2,2-bis(3,4-dicarboxyphenyl)hexafluoropropane dianhydride, and acid dianhydrides having the structures presented below, aliphatic tetracarboxylic dianhydride such as butanetetracarboxylic dianhydride, and aliphatic tetracarboxylic dianhydrides having a cyclic aliphatic group such as 1,2,3,4-cyclopentanetetracarboxylic dianhydride. Two or more kinds of these may be used.

[Chem. 4]

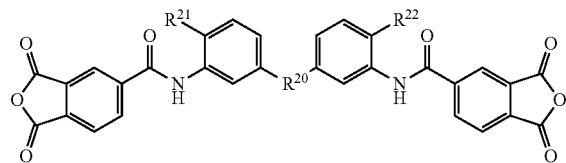

Examples of the acid may include dicarboxylic acids such as terephthalic acid, isophthalic acid, diphenyl ether dicarboxylic acid, bis(carboxyphenyl)hexafluoropropane, biphenyldicarboxylic acid, benzophenonedicarboxylic acid, and triphenyldicarboxylic acid, tricarboxylic acids such as trimellitic acid, trimesic acid, diphenyl ether tricarboxylic acid, and biphenyltricarboxylic acid, and aromatic tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl) ether, 1,2,5,6-naphthalenetetracarboxylic acid, 2,3,6,7-naphthalenetetracarboxylic acid, 2,3,5,6-pyridinetetracarboxylic acid, 3,4,9,10-perylenetetracarboxylic acid, aromatic tetracarboxylic acids having the structures presented below, aliphatic tetracarboxylic acids such as butanetetracarboxylic acid, and aliphatic tetracarboxylic acids having a cyclic aliphatic group such as 1,2,3,4-cyclopentanetetracarboxylic acid. Two or more kinds of these may be used.

[Chem. 5]

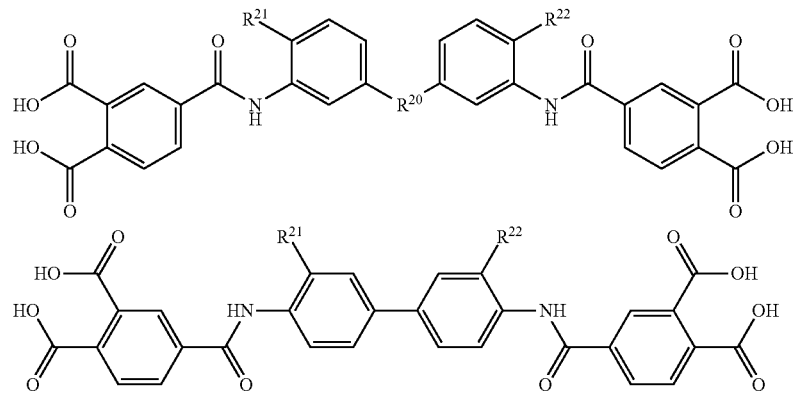

-continued

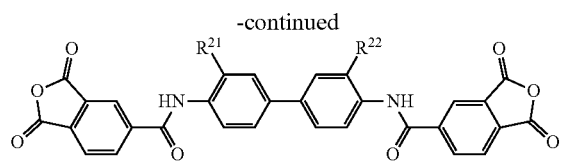

$R^{20}$ represents an oxygen atom, $C(CF_3)_2$, or $C(CH_3)_2$. $R^{21}$ and $R^{22}$ each represent a hydrogen atom or a hydroxyl group.

In the general formula (7), $R^{16}$—$(R^{18})_s$ represents a residue of an acid. $R^{16}$ is an organic group having a valence of 2 to 8, and among these, an organic group having 5 to 40 carbon atoms and containing an aromatic ring or a cyclic aliphatic group is preferable.

$R^{20}$ represents an oxygen atom, $C(CF_3)_2$, or $C(CH_3)_2$. $R^{21}$ and $R^{22}$ each represent a hydrogen atom or a hydroxyl group.

Among these, one or two carboxy groups correspond to $R^{18}$ in the general formula (7) in the case of a tricarboxylic acid or a tetracarboxylic acid. In addition, it is more preferable that the hydrogen atoms of the dicarboxylic acid, tricarboxylic acid or tetracarboxylic acid exemplified above are substituted with $R^{18}$ in the general formula (7), preferably with 1 to 4 hydroxyl groups. These acids may be used as they are, or may be used as an acid anhydride or an active ester.

$R^2$—$(R^{14})_q$ in the general formula (6) and $R^{15}$—$(R^{17})_r$ in the general formula (7) represent a residue of a diamine. $R^{12}$ and $R^{15}$ are an organic group having a valence of 2 to 8, and among these, an organic group having 5 to 40 carbon atoms and containing an aromatic ring or a cyclic aliphatic group is preferable.

Specific examples of the diamine include 3,4'-diaminodiphenyl ether, 4,4'-diaminodiphenyl ether, 3,4'-diaminodiphenylmethane, 4,4'-diaminodiphenylmethane, 1,4-bis(4-aminophenoxy)benzene, benzidine, m-phenylenediamine, p-phenylenediamine, 1,5-naphthalenediamine, 2,6-naphthalenediamine, bis(4-aminophenoxy)biphenyl, bis{4-(4-aminophenoxy)phenyl} ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene, 2,2'-bis(trifluoromethyl)-5,5'-dihydroxybenzidine, aromatic diamines such as compounds obtained by substituting at least some of the hydrogen atoms of aromatic rings of these with an alkyl group or a halogen atom, aliphatic diamines having a cyclic aliphatic group such as cyclohexyldiamine and methylenebiscyclohexylamine, and diamines having the structures presented below. Two or more kinds of these may be used.

[Chem. 6]

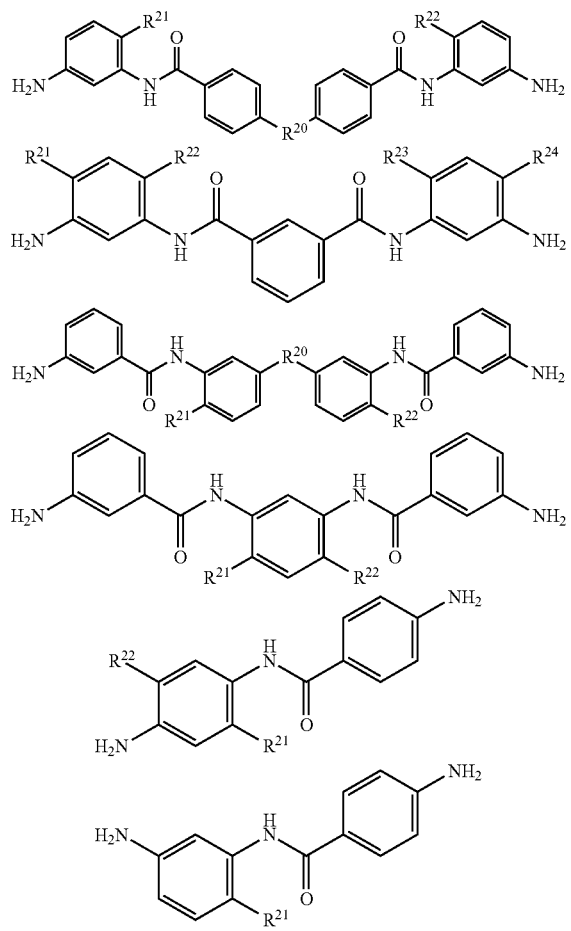

$R^{20}$ represents an oxygen atom, $C(CF_3)_2$, or $C(CH_3)_2$. $R^{21}$ to $R^{24}$ each independently represent a hydrogen atom or a hydroxyl group.

These diamines may be used as they are, or may be used as the corresponding diisocyanate compounds or trimethylsilylated diamines.

In addition, a resin having an acidic group at the main chain terminal can be obtained by capping the terminals of these resins with a monoamine having an acidic group, an acid anhydride, an acid chloride, a monocarboxylic acid, or an active ester compound.

Preferable examples of the monoamine having an acidic group include 5-amino-8-hydroxy quinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxy pyrimidine, 2-aminophenol, 3-aminophenol, 4-aminophenol, 2-aminothiophenol, 3-aminothiophenol, and 4-aminothiophenol. Two or more kinds of these may be used.

Preferable examples of the acid anhydride include phthalic anhydride, maleic anhydride, nadic anhydride, cyclohexanedicarboxylic anhydride, and 3-hydroxyphthalic anhydride. Two or more kinds of these may be used.

Preferable examples of the monocarboxylic acid include 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, and 1-mercapto-5-carboxynaphthalene. Two or more kinds of these may be used.

Preferable examples of the acid chloride include a monoacid chloride compounds in which the carboxy group of the monocarboxylic acids is converted into an acid chloride and monoacid chloride compounds in which only one carboxy group of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene is converted into an acid chloride. Two or more kinds of these may be used.

Preferable examples of the active ester compound include reaction products of the monoacid chloride compounds with N-hydroxybenzotriazole and N-hydroxy-5-norbornene-2,3-dicarboximide. Two or more kinds of these may be used.

An end-capping agent introduced into the resin can be easily detected by the following method. For example, a resin into which an end-capping agent has been introduced is dissolved in an acidic solution and decomposed into an amine component and an acid component which are constituent units of the resin, and these are subjected to the measurement of gas chromatograph (GC) and NMR, whereby the end-capping agent can be easily detected. In addition, it is possible to detect the end-capping agent by subjecting the resin into which the end-capping agent has been introduced to the measurement of pyrolysis gas chromatograph (PGC), infrared spectrum, and $^{13}$C-NMR spectrum.

The alkali-soluble resin (a) in the present invention is synthesized by a known method.

Examples of a method for producing a polyamic acid or a polyamic acid ester which is polyimide precursor include a method in which a tetracarboxylic dianhydride is reacted with a diamine compound at a low temperature, a method in which a diester is obtained from a tetracarboxylic dianhydride and an alcohol and then reacted with an amine in the presence of a condensing agent, and a method in which a diester is obtained from a tetracarboxylic dianhydride and an alcohol and then the remaining dicarboxylic acid is converted into an acid chloride and reacted with an amine.

Examples of a method for producing polyhydroxyamide which is polybenzoxazole precursor include a method in which a bisaminophenol compound and a dicarboxylic acid are subjected to a condensation reaction. Specific examples thereof include a method in which a dehydrating condensing agent such as dicyclohexylcarbodiimide (DCC) is reacted with an acid and a bisaminophenol compound is added thereto and a method in which a solution of dicarboxylic acid dichloride is added dropwise to a solution of a bisaminophenol compound to which a tertiary amine such as pyridine has been added.

Examples of a method for producing polyimide include a method in which the polyamic acid or polyamic acid ester obtained by the above-described method is subjected to dehydration cyclization. Examples of a method of dehydration cyclization include a chemical treatment using an acid, a base and the like and a heat treatment.

Examples of a method for producing polybenzoxazole include a method in which the polyhydroxyamide obtained by the above-described method is subjected to dehydration cyclization. Examples of a method of dehydration cyclization include a chemical treatment using an acid, a base and the like and a heat treatment.

Examples of the polyamide-imide precursor include polymers of a tricarboxylic acid, a corresponding tricarboxylic anhydride, and a tricarboxylic anhydride halide with a diamine compound, and a polymer of trimellitic anhydride chloride with an aromatic diamine compound is preferable. Examples of a method for producing the polyamide-imide precursor include a method in which a tricarboxylic acid, a corresponding tricarboxylic anhydride, a tricarboxylic anhydride halide or the like is reacted with a diamine compound at a low temperature.

Examples of a method for producing the polyamide-imide include a method in which trimellitic anhydride is reacted with an aromatic diisocyanate and a method in which the polyamide-imide precursor obtained by the above-described method is subjected to dehydration cyclization. Examples of a method of dehydration cyclization include a chemical treatment using an acid, a base and the like and a heat treatment.

<Alkali-Soluble Resin (b), Alkali-Soluble Resin (b1), and Alkali-Soluble Resin (b2)>

The resin composition of the present invention contains (b) an alkali-soluble resin (hereinafter simply referred to as "alkali-soluble resin (b)") having a monovalent or divalent group represented by the following general formula (1) in a structural unit in some cases. The alkali-soluble resin (b) is a resin obtained by modifying the phenolic hydroxyl group of a phenolic hydroxyl group-containing resin with a structure represented by the general formula (1).

In the production of the alkali-soluble resin (b), it is possible to adjust the alkali dissolution rate of the alkali-soluble resin (b) to a desired range by adjusting the modification rate of the phenolic hydroxyl group derived from a phenolic hydroxyl group-containing resin. Here, the modification rate denotes the proportion (mol %) of the number of moles of the structure which is represented by the general formula (1) and modified by the above reaction to the number of moles of the phenolic hydroxyl group derived from a phenolic hydroxyl group-containing resin.

The modification rate can be measured by the following method. The modification rate can be calculated, for example, by determining the ratios of the "number of protons in the phenolic hydroxyl group" to the "number of protons in the aromatic C—H" in the repeating structural unit of the phenolic hydroxyl group-containing resin before and after modification by 1H-NMR. The structural unit of the phenolic hydroxyl group-containing resin before modification can be analyzed by pyrolysis GC/MS, for example.

The modification rate is preferably 5 mol % or more, and the mechanical strength and chemical resistance of the cured film can be further improved since a sufficient crosslinking density is obtained even in the case of not containing a crosslinking agent. The modification rate is more preferably 10 mol % or more. Meanwhile, the modification rate is preferably 50 mol % or less, and it is possible to improve the solubility in an alkaline developer, to suppress the generation of a residue at the pattern opening, and to improve the light emission reliability when the cured film of the present invention to be described later is used as a planarization layer and/or an insulation layer of an organic EL display device. The modification rate is more preferably 25 mol % or less.

[Chem. 7]

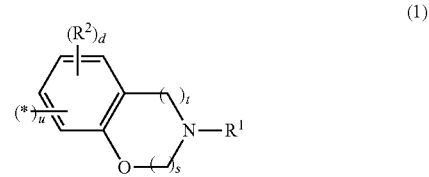

(1)

(In general formula (1), O represents an oxygen atom. $R^1$ represents a hydrogen atom or a hydrocarbon group which has 1 to 20 carbon atoms and may be substituted and $R^2$ represents an alkyl group having 1 to 5 carbon atoms. s and t each independently represent an integer from 0 to 3. Provided that (s+t)≥1. d represents an integer from 0 to 2. u represents an integer from 1 to 2, and * represents a chemical bond.) $R^1$ is preferably an aromatic hydrocarbon group from the viewpoint of improving the heat resistance. s and t are each preferably 1 from the viewpoint of ease of synthesis of the alkali-soluble resin (b).

The alkali-soluble resin (b) contains (b1) an alkali-soluble resin (hereinafter simply referred to as "alkali-soluble resin (b1)" in some cases) having a structural unit represented by the following general formula (2) and/or (b2) an alkali-soluble resin (hereinafter simply referred to as "alkali-soluble resin (b2)" in some cases) having a structural unit represented by the following general formula (3). The alkali-soluble resin (b) may contain the alkali-soluble resin (b1) and the alkali-soluble resin (b2), The alkali-soluble resin (b) may contain an alkali-soluble resin having a structural unit represented by the following general formula (2) and a structural unit represented by the following general formula (3), and this alkali-soluble resin is to be included in the alkali-soluble resin (b1). The alkali-soluble resin (b1) and the alkali-soluble resin (b2) have a benzoxazine skeleton in the resin, and thus a cured film exhibiting high chemical resistance and heat resistance can be obtained even in a case in which the alkali-soluble resin (b1) and the alkali-soluble resin (b2) are crosslinked with the alkali-soluble resin (a) and baked at a low temperature of 250° C. or less. In addition, the crosslinking reaction of benzoxazine does not generate outgas at the time of the crosslinking reaction, thus the shrinkage percentage at the time of curing is minor and a cured film generating less outgas can be obtained even in the case of conducting baking at a low temperature of 250° C. or less. Furthermore, a highly sensitive photosensitive resin composition can be obtained by combining the alkali-soluble resin (b1) and the alkali-soluble resin (b2) with (c) a photosensitive compound to be described later. It is preferable that the alkali-soluble resin (b) contains the alkali-soluble resin (b2) from the viewpoint of the light emission reliability when the cured film of the present invention to be described later is used as a planarization layer and/or an insulation layer of an organic EL display device.

[Chem. 8]

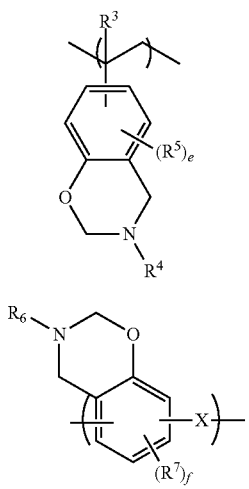

In general formula (2), $R^3$ represents a hydrogen atom or an alkyl group having 1 to 5 carbon atoms, $R^4$ represents a hydrocarbon group which has 1 to 20 carbon atoms and may be substituted, and $R^5$ represents an alkyl group having 1 to 5 carbon atoms. e represents an integer from 0 to 3. In general formula (3), X represents —$CH_2$—, —$CH_2OCH_2$— or a divalent aromatic group, $R^6$ represents a hydrocarbon group which has 1 to 20 carbon atoms and may be substituted, and $R^7$ represents an alkyl group having 1 to 5 carbon atoms. f represents an integer from 0 to 2. As the substituent of $R^4$ and $R^6$, an acidic group is preferable and a phenolic hydroxyl group, a carboxy group, a sulfonic acid group and the like is preferable. $R^3$ is preferably a hydrogen atom or a methyl group from the viewpoint of ease of synthesis of the alkali-soluble resin (b1). $R^4$ and $R^6$ are preferably an aromatic hydrocarbon group from the viewpoint of improving the heat resistance.

The alkali-soluble resin (b1) is preferably a copolymer having a structural unit represented by a general formula (4) and/or a structural unit represented by a general formula (5) in addition to the structural unit represented by the general formula (1) from the viewpoint of further improving the sensitivity and easily adjusting the solubility in an alkaline developer to a desired range. Furthermore, it is preferable to have the structural unit represented by the general formula (5) at 50 mol % or less from the viewpoint of solubility in an alkaline developer.

[Chem. 9]

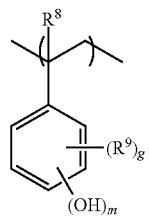

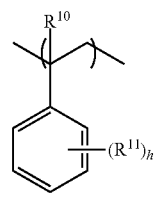

In general formula (4), $R^8$ represents a hydrogen atom or an alkyl group having 1 to 5 carbon atoms and $R^9$ represents an alkyl group having 1 to 5 carbon atoms. m represents an integer from 1 to 5, and g represents an integer from 0 to 4. In general formula (5), $R^{10}$ represents a hydrogen atom or an alkyl group having 1 to 5 carbon atoms and $R^{11}$ represents an alkyl group having 1 to 5 carbon atoms. h represents an integer from 0 to 5. $R^8$ and $R^{10}$ are preferably a hydrogen atom or a methyl group from the viewpoint of ease of synthesis of the alkali-soluble resin (b1) and the alkali-soluble resin (b2).

Examples of the method for producing the alkali-soluble resin (b1) include a method in which a hydroxystyrene resin is reacted with a primary amine and an aldehyde.

The hydroxystyrene resin can be obtained, for example, by polymerizing an aromatic vinyl compound. Examples of the aromatic vinyl compound include aromatic vinyl compounds having a phenolic hydroxyl group such as p-hydroxystyrene, m-hydroxystyrene, o-hydroxystyrene, p-isopropenylphenol, m-isopropenylphenol, and o-isopropenylphenol and aromatic vinyl compounds which does not have a hydroxyl group such as styrene, o-methylstyrene, m-methylstyrene, and p-methylstyrene. Two or more kinds of these may be used.

Examples of the primary amines include aliphatic amines and aromatic amines. Among these, aromatic amines are preferable from the viewpoint of improving heat resistance. Examples of the aromatic amine include aniline, methylaniline, dimethylaniline, ethylaniline, diethylaniline, trimethylaniline, methoxyaniline, ethoxyaniline, 4-methoxy-2-methylaniline, 2-methoxy-5-methylaniline, o-aminobenzoic acid, m-aminobenzoic acid, p-aminobenzoic acid, o-aminophenol, m-aminophenol, p-aminophenol, o-aniline sulfonic acid, m-aniline sulfonic acid, p-aniline sulfonic acid, 4-aminotoluene-3-sulfonic acid, 5-aminotoluene-2-sulfonic acid, 2-aminobenzenethiol, 3-aminobenzenethiol, 4-aminobenzenethiol, 2-aminophenyl acetic acid, 3-aminophenyl acetic acid, and 4-aminophenyl acetic acid. Two or more kinds of these may be used.

Examples of the aldehyde include formalin, paraformaldehyde, acetaldehyde, benzaldehyde, hydroxybenzaldehyde, and chloroacetaldehyde. Two or more kinds of these may be used.

The reaction temperature of the hydroxystyrene resin with the primary amine and the aldehyde is preferably 70° C. or more, and the generation of the benzoxazine ring can efficiently proceed. Meanwhile, the reaction temperature is preferably 120° C. or less, and it is possible to suppress the ring-opening reaction of the benzoxazine ring generated and an increase in the molecular weight or gelation.

In the production of the alkali-soluble resin (b1), it is possible to adjust the solubility of the alkali-soluble resin (b1) in an alkaline developer to a desired range by adjusting the modification rate of the phenolic hydroxyl group derived from a hydroxystyrene resin into a benzoxazine ring. Here, the modification rate denotes the proportion (mol %) of the number of moles of the benzoxazine ring modified by the above reaction to the number of moles of the phenolic hydroxyl group derived from a hydroxystyrene resin. The number of moles of the phenolic hydroxyl group derived from a hydroxystyrene resin can be determined by multiplying the proportion of the number of moles of the aromatic vinyl compound having a phenolic hydroxyl group in the aromatic vinyl compound used in the synthesis of the hydroxystyrene resin by the sum of the number of moles of the repeating units of the hydroxystyrene resin. The sum of the number of moles of the repeating units of the hydroxystyrene resin can be determined by determining the equivalents of the amounts of substances (moles) of the respective repeating units by dividing the masses of the respective repeating units constituting the hydroxystyrene resin by the formula weights of the respective repeating units and summing these. The number of moles of the benzoxazine ring can be determined from the number of moles of the primary amine reacted with the hydroxystyrene resin. The modification rate is preferably 5 mol % or more, and the mechanical strength and chemical resistance of the cured film can be further improved since a sufficient crosslinking density is obtained even in the case of not containing a crosslinking agent. The modification rate is more preferably 10 mol % or more. Meanwhile, the modification rate is preferably 50 mol % or less and more preferably 25 mol % or less, and it is possible to improve the solubility in an alkaline developer, to suppress the generation of a residue at the pattern opening, and to improve the light emission reliability when the cured film of the present invention to be described later is used as a planarization layer and/or an insulation layer of an organic EL display device. The modification rate is still more preferably 20 mol % or less.

The alkali-soluble resin (b2) is preferably a copolymer having a structural unit represented by a general formula (6) in addition to the structural unit represented by the general formula (3) from the viewpoint of further improving the sensitivity and easily adjusting the solubility in an alkaline developer to a desired range.

[Chem. 10]

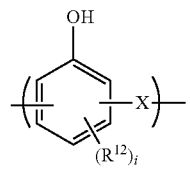

(6)

In general formula (6), X represents —CH$_2$—, —CH$_2$OCH$_2$— or a divalent aromatic group and R$^{12}$ represents an alkyl group having 1 to 5 carbon atoms. X is preferably —CH$_2$— from the viewpoint of ease of synthesis of the alkali-soluble resin (b2).

Examples of the method for producing the alkali-soluble resin (b2) include a method in which a phenolic resin is reacted with a primary amine and an aldehyde.

The phenolic resin can be obtained, for example, by polymerizing a phenol and an aldehyde. Examples of the phenol include phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylenebisphenol, methylenebis(p-cresol), resorcin, catechol, 2-methylresorcin, 4-methylresorcin, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol, and β-naphthol. Two or more kinds of these may be used.

Examples of the primary amine and aldehyde include the compounds exemplified as the primary amine and aldehyde constituting the alkali-soluble resin (b1).

The reaction temperature of the phenolic resin with the primary amine and the aldehyde is preferably 70° C. or more, and the generation of the benzoxazine ring can efficiently proceed. Meanwhile, the reaction temperature is preferably 120° C. or less, and it is possible to suppress the ring-opening reaction of the benzoxazine ring generated and an increase in the molecular weight or gelation.

In the production of the alkali-soluble resin (b2), it is possible to adjust the alkali dissolution rate of the alkali-soluble resin (b2) to a desired range by adjusting the modification rate of the phenolic hydroxyl group derived from a phenolic resin into a benzoxazine ring. Here, the modification rate denotes the proportion (mol %) of the number of moles of the benzoxazine ring modified by the above reaction to the number of moles of the phenolic hydroxyl group derived from a phenolic resin. The number of moles of the phenolic hydroxyl group derived from a phenolic resin can be determined by multiplying the proportion of the number of moles of the aromatic compound having a phenolic hydroxyl group in the aromatic compound used in the synthesis of the phenolic resin by the sum of the number of moles of the repeating units of the phenolic resin. The sum of the number of moles of the repeating units of the phenolic resin can be determined by determining the equivalents of the amounts of substances (moles) of the respective repeating units by dividing the masses of the respective repeating units constituting the phenolic resin by the formula weights of the respective repeating units and summing these. The number of moles of the benzoxazine ring can be determined from the number of moles of the primary amine reacted with the phenolic resin. The modification rate is preferably 5 mol % or more, and the mechanical strength and chemical resistance of the cured film can be further improved since a sufficient crosslinking density is obtained even in the case of not containing a crosslinking agent. The modification rate is more preferably 10 mol % or more. Meanwhile, the modification rate is preferably 50 mol % or less and more preferably 25 mol % or less, and it is possible to improve the solubility in an alkaline developer, to suppress the generation of a residue at the pattern opening, and to improve the light emission reliability when the cured film of the present invention to be described later is used as a planarization layer and/or an insulation layer of an organic EL display device. The modification rate is still more preferably 20 mol % or less.

The weight average molecular weights (Mw) of the alkali-soluble resin (b1) and the alkali-soluble resin (b2) are preferably 3,000 to 60,000 and more preferably 3,000 to 25,000 in terms of polystyrene. It is possible to easily adjust the solubility in an alkaline developer to a desired range by setting the molecular weight to 3000 or more. Meanwhile, it is possible to improve the coating property and developability of the resin composition by setting the molecular weight to 60,000 or less.

The content of the alkali-soluble resin (b1) and/or the alkali-soluble resin (b2) is preferably 5 parts by mass or more and more preferably 20 parts by mass or more with respect to 100 parts by mass of the alkali-soluble resin (a) from the viewpoint of further improving the chemical resistance of the cured film. Meanwhile, the content is preferably 300 parts by mass or less and more preferably 200 parts by mass or less from the viewpoint of improving the heat resistance of the cured film.

<(c) Photosensitive Compound>

The resin composition of the present invention preferably contains (c) a photosensitive compound and can be a photosensitive resin composition. Examples of the photosensitive compound (c) include (c1) a photoacid generator and (c2) a photoinitiator. The photoacid generator (c1) is a compound which generates an acid when being irradiated with light, and the photoinitiator (c2) is a compound which undergoes bond cleaves and/or a reaction when being exposed to light to generate a radical.

By containing the photoacid generator(c1), it is possible to obtain a positive relief pattern in which an acid is generated at the portion irradiated with light, the solubility of the portion irradiated with light in an alkali aqueous solution increases, and the portion irradiated with light dissolves in the alkali aqueous solution. In addition, by containing the photoacid generator (c1) and an epoxy compound or a thermal crosslinking agent to be described later, it is possible to obtain a negative relief pattern in which the acid generated at the portion irradiated with light accelerates the crosslinking reaction of the epoxy compound or the thermal crosslinking agent and the portion irradiated with light becomes insoluble. Meanwhile, by containing the photoinitiator (c2) and a radical polymerizable compound to be described later, it is possible to obtain a negative relief pattern in which radical polymerization proceeds at the portion irradiated with light and the portion irradiated with light becomes insoluble.

Examples of the photoacid generator (c1) include a quinone diazide compound, a sulfonium salt, a phosphonium salt, a diazonium salt, and an iodonium salt. It is preferable to contain two or more kinds of photoacid generators (b1), and a highly sensitive photosensitive resin composition can be obtained. A quinone diazide compound is particularly preferable as the photoacid generators (c1) from the viewpoint of the light emission reliability when the cured film of the present invention to be described later is used as a planarization layer and/or an insulation layer of an organic EL display device.

Examples of the quinone diazide compound include those in which sulfonic acid of quinone diazide is bonded to a polyhydroxy compound to form an ester, those in which sulfonic acid of quinone diazide is bonded to a polyamino compound to form a sulfonamide, and those in which sulfonic acid of quinone diazide is bonded to a polyhydroxy or polyamino compound to form an ester and/or a sulfonamide. It is preferable that 50 mol % or more of the whole functional groups of these polyhydroxy compound and polyamino compound is substituted with quinone diazide.

In the present invention, as quinone diazide, either of a 5-naphthoquinone diazide sulfonyl group or a 4-naphthoquinone diazide sulfonyl group is preferably used. A 4-naphthoquinone diazide sulfonyl ester compound has absorption in the i-line region of a mercury lamp and is suitable for exposure to i-line. Absorption of a 5-naphthoquinone diazide sulfonyl ester compound extends to the g-line region of the mercury lamp, and the 5-naphthoquinone diazide sulfonyl ester compound is suitable for g-line exposure. In the present invention, it is preferable to select a 4-naphthoquinone diazide sulfonyl ester compound or a 5-naphthoquinone diazide sulfonyl ester compound depending on the wavelength for exposure. In addition, a naphthoquinone diazide sulfonyl ester compound having a 4-naphthoquinone diazide sulfonyl group and a 5-naphthoquinone diazide sulfonyl group in the same molecule may be contained or a 4-naphthoquinone diazide sulfonyl ester compound and a 5-naphthoquinone diazide sulfonyl ester compound may be contained.

The quinone diazide compound can be synthesized from a compound having a phenolic hydroxyl group and a quinone diazide sulfonic acid compound by an arbitrary esterification reaction. The resolution, sensitivity, and residual film rate are further improved by use of these quinone diazide compounds.

Among the photoacid generators (c1), a sulfonium salt, a phosphonium salt, a diazonium salt, and an iodonium salt are preferable since these appropriately stabilize the acid component generated by exposure. Among these, a sulfonium salt is preferable. It is also possible to further contain a sensitizer and the like if necessary.

In the present invention, the content of the photoacid generator (c1) is preferably 0.01 to 50 parts by mass with respect to 100 parts by mass of the alkali-soluble resin (a) from the viewpoint of increasing the sensitivity. Among these, the content of quinone diazide compound is preferably 3 to 40 parts by mass. In addition, the total amount of a sulfonium salt, a phosphonium salt, a diazonium salt, and an iodonium salt is preferably 0.5 to 20 parts by mass.

Examples of the photoinitiator (c2) include a benzyl ketal-based photoinitiator, an α-hydroxy ketone-based photoinitiator, an α-aminoketone-based photoinitiator, an acylphosphine oxide-based photoinitiator, an oxime ester-based photoinitiator, an acridine-based photoinitiator, a titanocene-based photoinitiator, benzophenone-based photoinitiator, acetophenone-based photoinitiator, aromatic keto ester-based photoinitiator, and benzoic acid ester-based photoinitiator. Two or more kinds of photoinitiators (c2) may be contained. An α-aminoketone-based photoinitiator, an acylphosphine oxide-based photoinitiator, and an oxime ester-based photoinitiator are still more preferable from the viewpoint of further improving the sensitivity.

Examples of the α-amino ketone-based photoinitiator include 2-methyl-1-[4-(methylthio)phenyl]-2-morpholino propane-1-one, 2-benzyl-2-dimethylamino-1-(4-morpholino phenyl)-butane-1-one, 2-dimethylamino-2-(4-methylbenzyl)-1-(4-morpholino phenyl)-butane-1-one, or 3,6-bis(2-methyl-2-morpholinopropionyl)-9-octyl-9H-carbazol.

Examples of the acylphosphine oxide-based photoinitiator include 2,4,6-trimethylbenzoyl-diphenylphosphine oxide, bis(2,4,6-trimethylbenzoyl)-phenylphosphine oxide, or bis(2,6-dimethoxybenzoyl)-(2,4,4-trimethylpentyl)phosphine oxide.

Examples of the oxime ester-based photoinitiator include 1-phenylpropane-1,2-dione-2-(O-ethoxycarbonyl)oxime, 1-phenyl butane-1,2-dione-2-(O-methoxycarbonyl)oxime, 1,3-diphenylpropane-1,2,3-trione-2-(O-ethoxycarbonyl)oxime, 1-[4-(phenylthio)phenyl]octane-1,2-dione-2-(O-benzoyl)oxime, 1-[4-[4-(carboxyphenyl)thio]phenyl]propane- 1,2-dione-2-(O-acetyl)oxime, 1-[9-ethyl-6-(2-methylbenzoyl)-9H-carbazol-3-yl]ethanone-1-(O-acetyl) oxime, 1-[9-ethyl-6-[2-methyl-4-[1-(2,2-dimethyl-1,3-dioxolane-4-yl)methyloxy]benzoyl]-9H-carbazol-3-yl] ethanone-1-(O-acetyl)oxime, or 1-(9-ethyl-6-nitro-9H-carbazol-3-yl)-1-[2-methyl-4-(1-methoxypropane-2-yloxy) phenyl]methanone-1-(O-acetyl)oxime.

In the present invention, the content of the photoinitiator (c2) is preferably 0.1 parts by mass or more and more preferably 1 part by mass or more with respect to 100 parts by mass of the sum of the alkali-soluble resin (a) and a radical polymerizable compound to be described later from the viewpoint of further improving the sensitivity. Meanwhile, the content is preferably 25 parts by mass or less and more preferably 15 parts by mass or less from the viewpoint of further improving the resolution and decreasing the taper angle.

<Radical Polymerizable Compound>

The resin composition of the present invention may further contain a radical polymerizable compound.

The radical polymerizable compound refers to a compound having a plurality of ethylenically unsaturated double bonds in the molecule. As radical polymerization of the radical polymerizable compound proceeds by the radicals generated from the photoinitiator (c2) described above at the time of exposure and the portion irradiated with light becomes insoluble, and a negative pattern can be thus obtained. By further containing a radical polymerizable compound, the photo-curing at the portion irradiated with light is accelerated, and the sensitivity can be further improved. Moreover, the hardness of the cured film can be improved since the crosslinking density after heat curing is improved.

As the radical polymerizable compound, a compound which has a (meth)acrylic group and thus is likely to undergo radical polymerization is preferable. A compound having two or more kinds of (meth)acrylic groups in the molecule is more preferable from the viewpoint of improvement in the sensitivity at the time of exposure and improvement in the hardness of the cured film. The double bond equivalent of the radical polymerizable compound is preferably 80 to 400 g/mol from the viewpoint of improvement in the sensitivity at the time of exposure and improvement in the hardness of the cured film.

Examples of the radical polymerizable compound include trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 2,2-bis[4-(3-(meth)acryloyloxy-2-hydroxypropoxy)phenyl]propane, 1,3,5-tris((meth)acryloyloxyethyl)isocyanuric acid, 1,3-bis ((meth)acryloyloxyethyl)isocyanuric acid, 9,9-bis[4-(2-(meth)acryloyloxyethoxy)phenyl]fluorene, 9,9-bis[4-(3-(meth)acryloyloxypropoxy)phenyl]fluorene or 9,9-bis(4-(meth)acryloyloxyphenyl)fluorene or acid-modified products, ethylene oxide-modified products or propylene oxide-modified products of these.

In the present invention, the content of the radical polymerizable compound is preferably 15 parts by mass or more and more preferably 30 parts by mass or more with respect to 100 parts by mass of the sum of the alkali-soluble resin (a) and the radical polymerizable compound from the viewpoint of further improving the sensitivity and decreasing the taper angle. Meanwhile, the content is preferably 65 parts by mass or less and more preferably 50 parts by mass or less from the viewpoint of further improving the heat resistance of the cured film and decreasing the taper angle.

<Thermal Crosslinking Agent>

The resin composition of the present invention may contain a thermal crosslinking agent. A thermal crosslinking agent refers to a compound having at least two thermally reactive functional groups such as an alkoxymethyl group, a methylol group, an epoxy group, and an oxetanyl group in the molecule. By containing a thermal crosslinking agent, the alkali-soluble resin (a) or other additive components are crosslinked and the heat resistance, chemical resistance and hardness of the film after heat curing can be improved. In addition, the amount of outgas from the cured film can be further decreased and the long-term reliability of the organic EL display device can be improved.

Preferable examples of the compound having at least two alkoxymethyl groups or methylol groups include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (which are all trade names, manufactured by Honshu Chemical Industry Co., Ltd.), and "NIKALAC" (registered trademark) MX-290, "NIKALAC" MX-280, "NIKALAC" MX-270, "NIKALAC" MX-279, "NIKALAC" MW-100LM, and "NIKALAC" MX-750-LM (which are all trade names, manufactured by SANWA ChemICAL CO., LTD.).

Preferable examples of the compound having at least two epoxy groups include "Epolight" (registered trademark) 40E, "Epolight" 100E, "Epolight" 200E, "Epolight" 400E, "Epolight" 70P, "Epolight" 200P, "Epolight "400P," Epolight "1500NP," Epolight "80MF," Epolight" 4000, and "Epolight" 3002 (all manufactured by KYOEISHA ChemICAL CO., LTD.), "DENACOL" (registered trademark) EX-212L, "DENACOL" EX-214L, "DENACOL" EX-216L, and "DENACOL" EX-850L (all manufactured by Nagase ChemteX Corporation), GAN and GOT (all manufactured by Nippon Kayaku Co., Ltd.), "EPIKOTE" (registered trademark) 828, "EPIKOTE" 1002, "EPIKOTE" 1750, "EPIKOTE" 1007, YX8100-BH30, E1256, E4250, and E4275 (all manufactured by Mitsubishi Chemical Corporation), "EPICLON" (registered trademark) EXA-9583 and HP4032 (all manufactured by DIC Corporation), VG3101 (manufactured by Mitsui Chemicals, Inc.), "TEPIC" (registered trademark) S, "TEPIC" G, and "TEPIC" P (all manufactured by Nissan Chemical Corporation), "DENACOL" EX-321L (manufactured by Nagase ChemteX Corporation), NC 6000 (manufactured by Nippon Kayaku Co., Ltd.), "EPOTOHTO" (registered trademark) YH-434L (manufactured by NIPPON STEEL & SUMIKIN ChemICAL CO., LTD.), EPPN 502H and NC 3000 (manufactured by Nippon Kayaku Co., Ltd.), and "EPICLON" (registered trademark) N695 and HP7200 (all manufactured by DIC Corporation).

Preferable examples of the compound having at least two oxetanyl groups include ETERNACOLL EHO, ETERNACOLL OXBP, ETERNACOLL OXTP, and ETERNACOLL OXMA (all manufactured by UBE INDUSTRIES, LTD.) and oxetanized phenol novolac.

Two or more kinds of thermal crosslinking agents may be used in combination.

The content of the thermal crosslinking agent is preferably 1 part by mass or more and 30 parts by mass or less with respect to 100 parts by mass of the entire amount of the resin composition excluding the solvent. The chemical resistance and hardness of the cured film can be further enhanced when the content of the thermal crosslinking agent is 1 part by mass or more. In addition, the amount of outgas from the cured film is further decreased, the long-term reliability of the organic EL display device can be further enhanced, and the storage stability of the resin composition is also excellent when the content of the thermal crosslinking agent is 30 parts by mass or less.

<Organic Solvent>

The resin composition of the present invention may contain an organic solvent. By containing an organic solvent, the resin composition can be in a varnish state and the coating property can be improved.

Examples of the organic solvent include polar aprotic solvents such as γ-butyrolactone, ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tetrahydrofuran, and dioxane, ketones such as acetone, methyl ethyl ketone, diisobutyl ketone, cyclohexanone, 2-heptanone, 3-heptanone, and diacetone alcohol, esters such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, and ethyl lactate, other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate, aromatic hydrocarbons such as toluene and xylene, and amides such as N-methylpyrrolidone, N,N-dimethylformamide, and N,N-dimethylacetamide. Two or more kinds of these may be contained.

The content of the organic solvent is not particularly limited but is preferably 100 to 3,000 parts by mass and still more preferably 150 to 2,000 parts by mass with respect to 100 parts by mass of the entire amount of the photosensitive resin composition excluding the solvent. In addition, the proportion of a solvent having a boiling point of 180° C. or more to the entire amount of the organic solvent is preferably 20 parts by mass or less and more preferably 10 parts by mass or less. By setting the proportion of a solvent having a boiling point of 180° C. or more to 20 parts by mass or less, the amount of outgas after heat curing can be further decreased, and as a result, the long-term reliability of the organic EL device can be further enhanced.

<(d) Colorant>

The resin composition of the present invention may further contain (d) a colorant.

The colorant is a compound which absorbs light having a specific wavelength, and particularly, it refers to a compound which absorbs light having a wavelength of visible light (380 to 780 nm) to color the light. By containing a colorant, it is possible to color a film to be obtained from the resin composition, and it is possible to impart coloring property to color the light transmitted through the film of the resin composition or the light reflected from the film of the resin composition into a desired color to the film of the resin composition. In addition, it is possible to impart light blocking property to block light having a wavelength to be absorbed by the colorant from the light transmitted through the film of the resin composition or the light reflected from the film of the resin composition to the film of the resin composition.

Examples of the colorant include compounds which absorb light having a wavelength of visible light and color the light into white, red, orange, yellow, green, blue or violet. By combining two or more colors, it is possible to improve the color toning property to adjust the color of the light transmitted through the film of a desired resin composition of the resin composition or the light reflected from the film of the resin composition into a desired color coordinate.

As the colorant, a pigment and/or a dye is preferable. In addition, the colorant may be a black colorant or a colorant other than the black colorant.

The black colorant refers to a compound which absorbs light having a wavelength of visible light and colors the light into black, and it may be a pigment or a dye. By containing a black colorant, the film of the resin composition turns black, and it is thus possible to block the light transmitted through the film of the resin composition or the light reflected from the film of the resin composition and to improve the light blocking property. Hence, the film is suitable for a light blocking film such as a black matrix of a color filter or a black column spacer of a liquid crystal display or an application required to have a high contrast by suppression of external light reflection.

As the black colorant, a compound which absorbs light having all wavelengths of visible light and colors the light into black is preferable from the viewpoint of light blocking property. In addition, a mixture of compounds of two or more colors selected from the group consisting of white, red, orange, yellow, green, blue and violet is also preferable. By combining these of two or more colors, it is possible to color the light into black in a pseudo manner and to improve the light blocking property.

The black colorant preferably contains a black pigment, a black dye and/or a mixture of dyes of two or more colors, and it more preferably contains a black pigment from the viewpoint of light blocking property.

A colorant other than the black colorant is a compound which absorbs light having a wavelength of visible light and colors the light. In other words, it is a colorant which colors light into white, red, orange, yellow, green, blue or violet excluding black described above. By containing a colorant other than the black colorant, it is possible to impart the light blocking property, coloring property and color adjusting property to the film of the resin composition.

As the colorant other than the black colorant, pigments other than black pigments and/or dyes other than black dyes are preferable, and pigments other than black pigments are more preferable from the viewpoint of light blocking property and heat resistance or weather resistance.

The content of the colorant (d) is preferably 5 parts by mass or more and more preferably 15 parts by mass or more with respect to 100 parts by mass of the resin composition excluding the solvent. By containing the colorant at 5 parts by mass or more, it is possible to improve the light blocking property, coloring property and color adjusting property. Meanwhile, the content of colorant is preferably 70 parts by mass or less and more preferably 60 parts by mass or less. By containing the colorant at 70 parts by mass or less, it is possible to further improve the sensitivity.

<(e1) Amido-Phenol Compound and (e2) Aromatic Amic Acid Compound>

The resin composition of the present invention may contain (e1) an amido-phenol compound (hereinafter simply referred to as "amido-phenol compound (e1)" in some cases) having a monovalent group represented by the following general formula (7) at an ortho position of a phenolic hydroxyl group and/or (e2) an aromatic amic acid compound (hereinafter simply referred to as "aromatic amic acid compound (e2)" in some cases) having a monovalent group represented by the following general formula (8) at an ortho position of a carboxy group. The amido-phenol compound (e1) has a phenolic hydroxyl group and the aromatic amic acid compound (e2) has a carboxy group, and thus the phenolic hydroxyl group or the carboxy group accelerates the dissolution of the exposed portion at the time of development and the sensitivity can be increased for example, in the case of a positive photosensitive resin composition. Meanwhile, the amido-phenol compound (e1) has an amide group at the ortho position of the phenolic hydroxyl group and the aromatic amic acid compound (e2) has an amide group at the ortho position of the carboxy group, and thus the phenolic hydroxyl group or the carboxyl group as a polar group does not remain after curing by the cyclization dehydration reaction and a cured film exhibiting low water absorbing property can be obtained. It is preferable that the amido-phenol compound (e1) and the aromatic amic acid compound (e2) have two or more monovalent groups represented by the following general formula (7) or (8) from the viewpoint of further improving the solubility in an alkaline developer and the sensitivity.

[Chem. 11]

(7)

In general formula (7), Y represents a monovalent organic group having an alkyl group which has 2 to 20 carbon atoms and is directly bonded to a carbonyl carbon in the general formula (7) or a monovalent organic group having —(WO)$_n$—. W represents an alkylene group having 1 to 10 carbon atoms, and n represents an integer from 1 to 20.

When Y has an alkyl group which has 2 to 20 carbon atoms and is directly bonded to the carbonyl carbon in the general formula (7) or —(WO)$_n$—, the dehydration cyclization rate at 250° C. or less increases and thus the water absorption rate after curing can be decreased. When Y is a monovalent organic group having an alkyl group, the number of carbon atoms is preferably 10 or less and more preferably 6 or less from the viewpoint of improving the heat resistance. When Y is a monovalent organic group having —(WO)$_n$—, W is preferably a methylene group, an ethylene group, a propylene group or a butylene group from the viewpoint of improving the heat resistance. In a case in which W is a methylene group, n is preferably 2 or more from the viewpoint of increasing the dehydration cyclization rate. n is more preferably 3 or more. In addition, n is preferably 10 or less from the viewpoint of improving the heat resistance. In a case in which W is a group other than a methylene group, n is preferably 2 to 10 from the viewpoint of improving the heat resistance. In addition, from the viewpoint of improving the heat resistance, Y may optionally have a substituent, and it is preferable to have, for example, an aryl group at the terminal.

[Chem. 12]

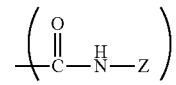

(8)

In general formula (8), Z represents a monovalent organic group having an alkyl group which has 2 to 20 carbon atoms and is directly bonded to amide nitrogen in the general formula (8) or a monovalent organic group having —(WO)$_n$—. W represents an alkylene group having 1 to 10 carbon atoms, and n represents an integer from 1 to 20.

When Z has an alkyl group which has 2 to 20 carbon atoms and is directly bonded to the amide nitrogen in the general formula (8) or —(WO)$_n$—, the dehydration cyclization rate at 250° C. or less increases and thus the water absorption rate after curing can be decreased. When Z is an alkyl group, the number of carbon atoms is preferably 10 or less and more preferably 6 or less from the viewpoint of improving the heat resistance. When Z is a monovalent organic group having —(WO)$_n$—, W is preferably a methylene group, an ethylene group, a propylene group or a butylene group from the viewpoint of improving the heat resistance. In a case in which W is a methylene group, n is preferably 2 or more from the viewpoint of increasing the dehydration cyclization rate. n is more preferably 3 or more. In addition, n is preferably 10 or less from the viewpoint of improving the heat resistance. In a case in which W is a group other than a methylene group, n is preferably 2 to 10 from the viewpoint of improving the heat resistance. In addition, from the viewpoint of improving the heat resistance, Z may optionally have a substituent, and it is preferable to have, for example, an aryl group at the terminal.

Y in the general formula (7) and Z in the general formula (8) are an alkyl group having 2 to 20 carbon atoms, and examples thereof may include ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, and icosyl. In addition, W in the general formula (7) and the general formula (8) is an alkylene group having 1 to 10 carbon atoms, and examples thereof may include methylene, ethylene, propylene, butylene, pentylene, hexylene, heptylene, octylene, and decylene.

Examples of the amido-phenol compound (e1) in the present invention include compounds represented by any of the following general formulas (9) to (11). Such a compound can also be used as a dissolution accelerator.

[Chem. 13]

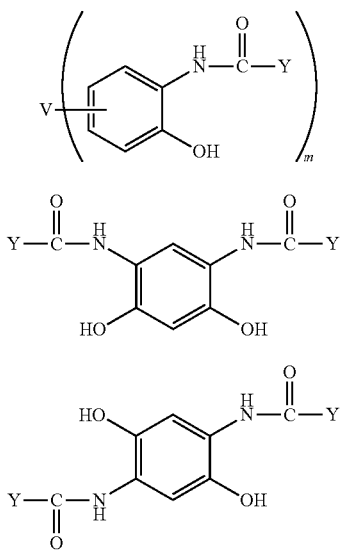

In the general formulas (9) to (11), m represents an integer from 1 to 4. Y represents a monovalent organic group having an alkyl group which has 2 to 20 carbon atoms and is directly bonded to a carbonyl carbon in the general formulas (9) to (11) or a monovalent organic group having —(WO)$_n$—. W represents an alkylene group having 1 to 10 carbon atoms, and n represents an integer from 1 to 20.

When Y is a monovalent organic group having an alkyl group, the number of carbon atoms is preferably 10 or less and more preferably 6 or less. When Y is a monovalent organic group having —(WO)$_n$—, W is preferably a methylene group, an ethylene group, a propylene group or a butylene group. In a case in which W is a methylene group, n is preferably 2 or more and more preferably 3 or more. In addition, n is preferably 10 or less. In a case in which W is a group other than a methylene group, n is preferably 2 to 10. In addition, Y may optionally have a substituent, and it is preferable to have, for example, an aryl group at the terminal.

In the general formulas (9) to (11), V represents a single bond, a hydrogen atom, an alkoxy group, —O—, —SO$_2$—, —C(CF$_3$)$_2$—, —O—R$^{23}$—O—, —C(=O)—, —C(=O)O—R$^{24}$—OC(=O)—, —C(=O)NH—R$^{25}$—NHC(=O)— or a hydrocarbon group having 1 to 20 carbon atoms and a valence of 1 to 4. R$^{23}$ to R$^{25}$ represent a divalent hydrocarbon group having 1 to 20 carbon atoms. The number of carbon atoms in the hydrocarbon group is more preferably 1 to 10 from the viewpoint of improving the solubility. The hydrocarbon group may be saturated or unsaturated. However, m=2 in a case in which V is a single bond.

The amido-phenol compound (e1) to be used in the present invention can be obtained by reacting a compound having an amino group at the ortho position of the phenolic hydroxyl group or its hydrochloride with a corresponding acid chloride. Examples of the compound having an amino group at the ortho position of the phenolic hydroxyl group include hydroxyl group-containing diamines such as 2-aminophenol, 2,4-dihydroxy-m-phenylenediamine, 2,5-dihydroxy-p-phenylenediamine, 4,6-diaminoresorcinol, 3,3'-diamino-4,4'-dihydroxydiphenyl, 4,4'-diamino-3,3'-dihydroxydiphenyl, 3,4'-diamino-3',4-dihydroxydiphenyl, 3,3'-diamino-4,4'-dihydroxydiphenyl ether, 4,4'-diamino-3,3'-dihydroxydiphenyl ether, 3,4'-diamino-3',4-dihydroxydiphenyl ether, 3,3'-diamino-4,4'-dihydroxydiphenylhexafluoropropane, 4,4'-diamino-3,3'-dihydroxydiphenylhexafluoropropane, 3,4'-diamino-3',4-dihydroxydiphenylhexafluoropropane, 3,3'-diamino-4,4'-dihydroxybenzophenone, 4,4'-diamino-3,3'-dihydroxybenzophenone, 3,4'-diamino-3',4-dihydroxybenzophenone, 3,3'-diamino-4,4'-dihydroxydiphenylsulfone, 4,4'-diamino-3,3'-dihydroxydiphenylsulfone, 3,4'-diamino-3',4-dihydroxydiphenylsulfone, bis(3-amino-4-hydroxyphenyl)propane, bis(3-amino-4-hydroxyphenyl)methylene, bis(3-amino-4-hydroxyphenyl)fluorene, and 2,2'-bis(trifluoromethyl)-5,5'-dihydroxybenzidine and compounds obtained by substituting some of the hydrogen atoms of aromatic rings of these with an alkyl group having 1 to 10 carbon atoms, a fluoroalkyl group, a halogen atom and the like.

Examples of the acid chloride include acid chlorides such as propanoyl chloride, butanoyl chloride, pentanoyl chloride, hexanoyl chloride, heptanolyl chloride, octanoyl chloride, nonanoyl chloride, decanoyl chloride, and lauroyl chloride, compounds obtained by substituting some of the hydrogen atoms of these with an alkyl group having 1 to 10 carbon atoms, and compounds in which a methyl group at the terminal is substituted with an aryl group.

Examples of the aromatic amic acid compound (e2) in the present invention include compounds represented by any of the following general formulas (12) to (16). Such a compound can also be used as a dissolution accelerator.

[Chem. 14]

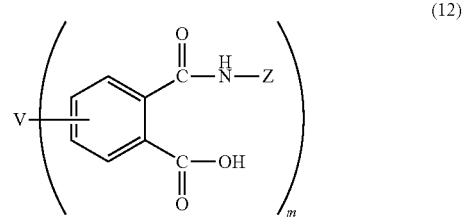

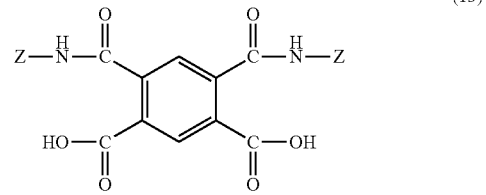

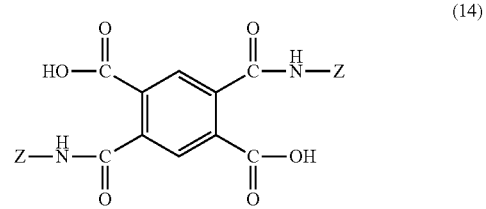

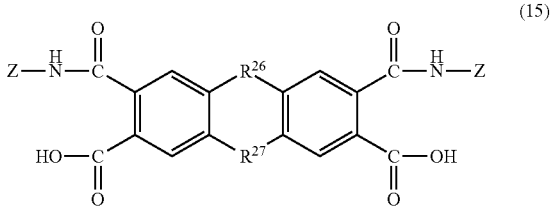

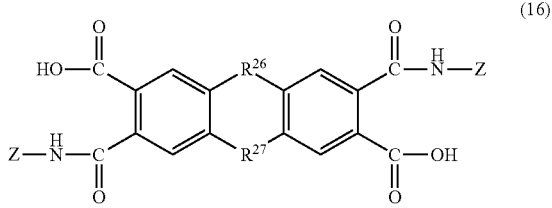

(16)

In the general formulas (12) to (16), m represents an integer from 1 to 4. Z represents a monovalent organic group having an alkyl group which has 2 to 20 carbon atoms and is directly bonded to the amide nitrogen in the general formulas (12) to (16) or a monovalent organic group having —(WO)$_n$—. W represents an alkylene group having 1 to 10 carbon atoms, and n represents an integer from 1 to 20.

When Z is a monovalent organic group having an alkyl group, the number of carbon atoms is preferably 10 or less and more preferably 6 or less. When Z is a monovalent organic group having —(WO)$_n$—, W is preferably a methylene group, an ethylene group, a propylene group or a butylene group. In a case in which W is a methylene group, n is preferably 2 or more and more preferably 3 or more. In addition, n is preferably 10 or less. In a case in which W is a group other than a methylene group, n is preferably 2 to 10. In addition, Z may optionally have a substituent, and it is preferable to have, for example, an aryl group at the terminal.

In the general formulas (12) to (16), V represents a single bond, a hydrogen atom, an alkoxy group, —O—, —SO$_2$—, —C(CF$_3$)$_2$—, —O—R$^{23}$—O—, —C(=O)—, —C(=O)O—R$^{24}$—OC(=O)—, —C(=O)NH—R$^{25}$—NHC(=O)— or a hydrocarbon group having 1 to 20 carbon atoms and a valence of 1 to 4. R$^{23}$ to R$^{25}$ represent a divalent hydrocarbon group having 1 to 20 carbon atoms, and R$^{26}$ and R$^{27}$ represent —C(CH$_3$)$_2$—, —C(CF$_3$)$_2$—, —O—, or —S—. The number of carbon atoms in the hydrocarbon group is more preferably 1 to 10 from the viewpoint of improving the solubility. The hydrocarbon group may be saturated or unsaturated. However, m=2 in a case in which V is a single bond.

The aromatic amic acid compound (e2) to be used in the present invention can be obtained by reacting an acid anhydride, an acid dianhydride, a dicarboxylic acid compound, or a tetracarboxylic acid compound with a corresponding primary amine.

Examples of the acid anhydride include phthalic anhydride. Examples of the acid dianhydride include the aromatic tetracarboxylic dianhydrides exemplified as the acid dianhydride constituting the polyimide. Examples of the dicarboxylic acid include phthalic acid. Examples of the tetracarboxylic acid include the aromatic tetracarboxylic acids exemplified as the tetracarboxylic acid constituting the polyimide precursor or the polybenzoxazole precursor.

Examples of the primary amine include aliphatic amines such as ethylamine, propylamine, butylamine, pentylamine, hexylamine, heptylamine, octylamine, nonylamine, decylamine, and dodecylamine, compounds obtained by substituting some of the hydrogen atoms of these with an alkyl group having 1 to 10 carbon atoms, and compounds in which a methyl group at the terminal is substituted with an aryl group.

The content of the amido-phenol compound (e1) and/or aromatic amic acid compound (e2) in the resin composition of the present invention is preferably 1 part by mass or more and more preferably 3 parts by mass or more with respect to 100 parts by mass of the alkali-soluble resin (a) from the viewpoint of further improving the sensitivity. In addition, the content is preferably 50 parts by mass or less and more preferably 40 parts by mass or less from the viewpoint of improving the heat resistance.

<Adhesion Promoter>

The resin composition of the present invention may contain an adhesion promoter. Examples of the adhesion promoter include silane coupling agents such as vinyltrimethoxysilane, vinyltriethoxysilane, epoxycyclohexylethyltrimethoxysilane, 3-glycidoxypropyltrimethoxysilane, 3-glycidoxypropyltriethoxysilane, p-styryltrimethoxysilane, 3-aminopropyltrimethoxysilane, 3-aminopropyltriethoxysilane, and N-phenyl-3-aminopropyltrimethoxysilane, a titanium chelating agent, an aluminum chelating agent, and a compound obtained by reacting an aromatic amine compound with an alkoxy group-containing silicon compound. Two or more kinds of these may be contained. By containing these adhesion promoters, it is possible to enhance the adhesive property to ground substrates such as a silicon wafer, ITO, SiO$_2$, and silicon nitride in the case of developing a resin film and the like. In addition, it is possible to enhance the resistance to oxygen plasma to be used in cleaning and the like and the resistance to an UV ozone treatment. The content of the adhesion promoter is preferably 0.1 to 10 parts by mass with respect to 100 parts by mass of the entire amount of the resin composition excluding the solvent.

<Surfactant>

The resin composition of the present invention may contain a surfactant if necessary, and the wettability with the substrate can be improved. Examples of the surfactant include fluorine-based surfactants such as SH series, SD series, ST series of Dow Corning Toray Co., Ltd., BYK series of BYK Additives & Instruments, KP series of Shin-Etsu Chemical Co., Ltd., DISFOAM series of NOF CORPORATION, "MEGAFACE (registered trademark)" series of DIC Corporation, FLUORAD series of 3M, "SURFLON (registered trademark)" series of AGC SEIMI ChemICAL CO., LTD. Co., Ltd., "Asahi Guard (registered trademark)" series of AGC, and PolyFox series of Omnova Solutions Inc. and acrylic and/or methacrylic surfactants such as POLYFLOW series of KYOEISHA ChemICAL CO., LTD. and "DISPARLON (registered trademark)" series of Kusumoto Chemicals, Ltd.

The content of the surfactant is preferably 0.001 to 1 part by mass with respect to 100 parts by mass of the entire amount of the resin composition excluding the solvent.

<Inorganic Particles>

The resin composition of the present invention may contain inorganic particles. Preferable specific examples of the inorganic particles include silicon oxide, titanium oxide, barium titanate, alumina, and talc. The primary particle diameter of the inorganic particles is preferably 100 nm or less and more preferably 60 nm or less.

The content of the inorganic particles is preferably 5 to 90 parts by mass with respect to 100 parts by mass of the entire amount of the resin composition excluding the solvent.

<Thermal Acid Generator>

The resin composition of the present invention may contain a thermal acid generator in a range in which the long-term reliability of organic EL display device is not impaired. The thermal acid generator generates an acid by being heated and accelerates the crosslinking reaction of the thermal crosslinking agent and also can accelerate the cyclization of the ring structures and thus further improve the mechanical characteristics of the cured film in a case in which the resin of component (a) has a non-closed imide ring structure and a non-closed oxazole ring structure.

The thermal decomposition starting temperature of the thermal acid generator to be used in the present invention is preferably 50° C. to 270° C. and more preferably 250° C. or less. In addition, it is preferable to select a thermal acid generator which does not generate an acid at the time of drying (prebaking: about 70° C. to 140° C.) after the resin composition of the present invention is applied on a substrate but generates an acid at the time of final heating (curing: about 100° C. to 400° C.) after patterning is conducted by exposure and development subsequent to the drying since a decrease in sensitivity at the time of development can be suppressed.

The acid to be generated from the thermal acid generator to be used in the present invention is preferably a strong acid, for example, an arylsulfonic acid such as p-toluenesulfonic acid or benzenesulfonic acid, an alkyl sulfonic acid such as methanesulfonic acid, ethanesulfonic acid, propanesulfonic acid, or butanesulfonic acid, a haloalkylsulfonic acid such as trifluoromethylsulfonic acid, and the like are preferable. These are used as a salt such as an onium salt or as a covalent compound such as an imidosulfonate. Two or more kinds of these may be contained.

The content of the thermal acid generator is preferably 0.01 parts by mass or more and more preferably 0.1 parts by mass or more with respect to 100 parts by mass of the entire amount of the resin composition excluding the solvent. By containing the thermal acid generator at 0.01 parts by mass or more, the crosslinking reaction and the cyclization of the non-closed structure of the resin are accelerated and thus the mechanical characteristics and chemical resistance of the cured film can be further improved. In addition, the content is preferably 5 parts by mass or less and more preferably 2 parts by mass or less from the viewpoint of long-term reliability of organic EL display device.

<Method for Producing Resin Composition>

Next, a method for producing the resin composition of the present invention will be described. The resin composition can be obtained by dissolving, for example, the alkali-soluble resin (a) and the alkali-soluble resin (b) and, if necessary, the photosensitive compound (c), the colorant (d), a thermal crosslinking agent, a solvent, an adhesion promoter, a surfactant, a compound having a phenolic hydroxyl group, inorganic particles, a thermal acid generator and the like. Examples of the dissolution method include stirring and heating. In the case of heating, the heating temperature is preferably set in a range in which the performance of the resin composition is not impaired, and it is usually from room temperature to 80° C. In addition, the order of dissolving the respective components is not particularly limited, and examples thereof include a method in which compounds exhibiting lower solubility are first dissolved. In addition, it is possible to prevent dissolution failure of other components due to generation of bubbles by finally adding components which are likely to generate bubbles at the time of stirring and dissolution such as a surfactant and some of adhesion promoters after other components are dissolved.

It is preferable that the resin composition obtained is filtered using a filtration filter to remove dust and particles. The pore size of filter is, for example, 0.5 μm, 0.2 μm, 0.1 μm, 0.07 μm, 0.05 μm, and 0.02 μm, but it is not limited thereto. As the material for the filter, there are polypropylene (PP), polyethylene (PE), nylon (NY), polytetrafluoroethylene (PTFE) and the like, and polyethylene and nylon are preferable.

<Resin Sheet>

The resin sheet of the present invention is formed from the resin composition.

The sheet of the present invention can be obtained, for example, by applying the resin composition described above on a releasable substrate such as polyethylene terephthalate to obtain a coating film of the resin composition and drying the coating film. A protective film may be further laminated thereon.

Examples of the coating method include a spin coating method, a slit coating method, a dip coating method, a spray coating method, and a printing method. Among these, a slit coating method by which coating can be conducted using a small amount of coating liquid is preferable since this method is advantageous from the viewpoint of cutting down the cost. The amount of the coating liquid required for the slit coating method is, for example, about ⅕ to 1/10 as compared with that required for the spin coating method. As the slit nozzle to be used for coating, for example, those that are on the market from plural manufacturers such as "Linear Coater" manufactured by SCREEN Holdings Co., Ltd., "Spinless" manufactured by TOKYO OHKA KOGYO CO., LTD., "TS Coater" manufactured by Toray Engineering Co., Ltd., "Table Coater" manufactured by Chugai Ro Co., Ltd., "CS Series" and "CL Series" manufactured by Tokyo Electron Ltd., "In-line type slit coater" manufactured by CERMA PRECISION, INC., and "Head coater HC series" manufactured by Hirata Corporation can be selected. The coating speed is generally in a range of 10 mm/sec to 400 mm/sec. The thickness of the coating film varies depending on the solid concentration, viscosity, and the like of the resin composition, but the resin composition is usually applied so that the film thickness after drying is 0.1 to 10 μm and preferably 0.3 to 5 μm.

Prior to coating, the substrate to be coated with the resin composition may be pretreated with the adhesion promoter described above in advance. Example of a pretreatment method include a method in which the surface of the substrate is treated with a solution in which the adhesion promoter is dissolved in a solvent such as isopropanol, ethanol, methanol, water, tetrahydrofuran, propylene glycol monomethyl ether acetate, propylene glycol monomethyl ether, ethyl lactate, or diethyl adipate at 0.5 to 20 mass %. Examples of a method for treating the surface of the substrate include methods such as a spin coating method, a slit die coating method, a bar coating method, a dip coating method, a spray coating method, and a vapor treatment method.

After coating, a drying under reduced pressure is conducted if necessary. It is general to subject the substrate on which the coating film is formed to drying under reduced pressure. Examples of the method for drying under reduced pressure include a method in which a substrate on which the coating film is formed is placed on a proxy pin disposed in a vacuum chamber and dried under reduced pressure by decreasing the internal pressure of the vacuum chamber. It is preferable to adjust the height of the proxy pin so as to narrow the space between the substrate and the vacuum chamber top plate in order to suppress the haze which occurs as a large quantity of the air located between the substrate and the vacuum chamber top plate flows along with the drying under reduced pressure at this time. The distance between the substrate and the vacuum chamber top plate is preferably about 2 to 20 mm and more preferably 2 to 10 mm.

The speed of drying under reduced pressure also depends on the vacuum chamber volume, the vacuum pump capacity, the pipe diameter between the chamber and the pump, and the like, but for example, it is preferable to set the conditions such that the internal pressure of the vacuum chamber is decreased to 40 Pa after the elapse of 60 seconds in a state in which the coated substrate is not present. A general time for drying under reduced pressure is about 30 seconds to 100 seconds, and the ultimate pressure in the vacuum chamber at the time of completion of drying under reduced pressure is usually 100 Pa or less in a state in which the coated substrate is present. By setting the ultimate pressure to 100 Pa or less, it is possible to obtain a dried state in which the stickiness of the surface of coating film is diminished, and this makes it possible to suppress surface contamination and generation of particles in the subsequent substrate transfer.

After coating or drying under reduced pressure, it is general to heat and dry the coating film. This step is also called prebaking. For drying, a hot plate, an oven, infrared rays and the like are used. In the case of using a hot plate, the coated film is held directly on a plate or on a jig such as a proxy pin disposed on the plate and heated. Examples of a material for the proxy pin include a metal material such as aluminum or stainless steel, polyimide resin, and a synthetic resin such as "Teflon" (registered trademark). A proxy pin made of any material can be used as long as it exhibits heat resistance. The height of proxy pin varies depending on the size of the substrate, the kind of the coating film, the purpose of heating, and the like, but it is preferably about 0.1 to 10 mm. The heating temperature and the heating time vary depending on the kind and purpose of the coating film, but the heating temperature is preferably 50° C. to 180° C. and the heating time is preferably 1 minute to several hours.

A pattern can be formed in a case in which the resin sheet is photosensitive. For example, a desired pattern can be formed by irradiating the photosensitive resin sheet with actinic rays through a mask having the desired pattern for exposure and conducting development.

Examples of the actinic rays to be used for exposure include ultraviolet light, visible light, electron beams, and X-ray. In the present invention, it is preferable to use i-line (365 nm), h-line (405 nm) and g-line (436 nm) of a mercury lamp. In the case of exhibiting positive type photosensitivity, the exposed portion dissolves in the developer. In the case of exhibiting negative type photosensitivity, the exposed portion is cured and does not dissolve in the developer.

After exposure, a desired pattern is formed by removing the exposed portion in the case of a positive type and the unexposed portion in the case of a negative type using a developer. As the developer, an aqueous solution of a compound exhibiting alkalinity such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine is preferable. One or more kinds of a polar solvent such as N-methyl-2-pyrrolidone, N,N-dimethylformamide, N,N-dimethylacetamide, dimethylsulfoxide, γ-butyrolactone, or dimethylacrylamide, an alcohol such as methanol, ethanol, or isopropanol, an ester such as ethyl lactate or propylene glycol monomethyl ether acetate, a ketone such as cyclopentanone, cyclohexanone, isobutyl ketone, or methyl isobutyl ketone or the like may be added to these alkali aqueous solutions. Examples of the developing method include methods by spraying, paddling, dipping, ultrasonic wave and the like.

Next, it is preferable to rinse the pattern formed by development with distilled water. Alcohols such as ethanol and isopropyl alcohol, esters such as ethyl lactate and propylene glycol monomethyl ether acetate, and the like may be added to distilled water and this solution may be used in the rise treatment.

<Cured Film>

The cured film of the present invention can be obtained by curing the resin sheet or resin composition.

By heating and curing the resin composition and resin sheet described above, it is possible to remove components exhibiting low heat resistance and thus to further improve the heat resistance and chemical resistance. Particularly in a case in which the resin composition or resin sheet of the present invention contains polyimide precursor, polybenzoxazole precursor, a copolymer thereof, or a copolymer thereof with polyimide, it is possible to further improve the heat resistance and chemical resistance since the imide ring and oxazole ring are formed by heat and curing. The alkali-soluble resin (b1) and the alkali-soluble resin (b2) have a benzoxazine skeleton in the resin, thus the crosslinking reaction thereof with the alkali-soluble resin (a) can proceed by the heating and curing and it is possible to further improve the chemical resistance and heat resistance. Incidentally, some of the crosslinking groups tend to remain unreacted generally in the case of conducting baking at a low temperature of 250° C. or less. However, in the present invention, outgas is not generated at the time of the crosslinking reaction of benzoxazine, thus the shrinkage percentage at the time of curing is minor and the generation of outgas from the cured film can be suppressed even if unreacted crosslinking groups remain.

The temperature for heating and curing is preferably 300° C. or more and more preferably 350° C. or more from the viewpoint of further decreasing the amount of outgas generated from the cured film. Meanwhile, the temperature is preferably 500° C. or less and more preferably 450° C. or less from the viewpoint of improving the toughness of the cured film. In this temperature range, the temperature may be raised stepwise or may be continuously raised. The time for heating and curing is preferably 30 minutes or more from the viewpoint of further decreasing the amount of outgas. In addition, the time is preferably 3 hours or less from the viewpoint of improving the toughness of the cured film. For example, there are a method in which the heat treatment is conducted at 150° C. for 30 minutes and at 250° C. for 30 minutes and a method in which the heat treatment is conducted while linearly raising the temperature from room temperature to 300° C. over 2 hours.

The resin composition, resin sheet, and cured film of the present invention are suitably used in a surface protective layer and an interlayer insulation layer of a semiconductor device, an insulation layer of an organic electroluminescence (hereinafter referred to as EL) device, a planarization layer of a thin film transistor (hereinafter referred to as TFT) substrate for driving of a display device using an organic EL device, a wire protective insulation layer of a circuit board, an on-chip microlens of a solid-state image sensing device, and a planarization layer for various displays/solid-state image sensing devices. The resin composition, resin sheet, and cured film of the present invention are suitable as a surface protective layer or an interlayer insulation layer of, for example, MRAM exhibiting low heat resistance, polymer ferroelectric RAM (PFRAM) promising as next-generation memory, phase change RAM (PCRAM), and ovonics unified memory (OUM). In addition, the resin composition, resin sheet, and cured film of the present invention can be used in an insulation layer of a display device including a first electrode formed on a substrate and a second electrode provided to face the first electrode, for example, a display device (organic electroluminescence device) including an LCD, an ECD, an ELD, and an organic electroluminescence device. Hereinafter, an organic EL display device, a semiconductor equipment, and a semiconductor electronic component will be described as examples.

<Organic EL Display Device>

The organic EL display device of the present invention includes a driving circuit, a planarization layer, a first electrode, an insulation layer, a light-emitting layer, and a second electrode on a substrate, in which the planarization layer and/or the insulation layer are formed of the cured film of the present invention. Organic EL light-emitting materials are susceptible to degradation by moisture and adversely affect the device so that the area ratio of the light-emitting portions to the area of the light-emitting pixels decreases. However, the cured film of the present invention has a low water absorption rate and thus stable driving and light-emitting characteristics can be obtained. In the case of an active matrix type display device as an example, a TFT and a wire which is located on a side portion of the TFT and connected to the TFT are provided on a substrate made of glass or various kinds of plastics, a planarization layer is provided thereon so as to cover the concave and convex, and a display device is further provided on the planarization layer. The display device and the wire are connected to each other via a contact hole formed on the planarization layer.

The film thickness of the planarization layer in the organic EL display device of the present invention is preferably 1.0 to 5.0 μm and more preferably 2.0 μm or more. By setting the planarization layer to be in the above range, it is possible to improve the flatness of the densely packed TFT and wire by high definition. When the thickness of the planarization layer is increased, the outgas is increased and the light emission reliability of the organic EL display device is diminished. However, the generation of outgas from the cured film of the present invention is minor, and thus high light emission reliability can be obtained. In addition, the TFT and the wire can also be disposed in the film thickness direction for high definition, and thus the planarization layer is preferably multilayered.

A cross-sectional view of an example of a TFT substrate is illustrated in FIG. 1. Bottom-gate type or top-gate type TFTs (thin film transistors) 1 are provided on a substrate 6 in rows and columns, and a TFT insulation layer 3 is formed so as to cover these TFTs 1. In addition, a wire 2 connected to the TFT 1 is provided on this TFT insulation layer 3. Furthermore, a planarization layer 4 is provided on the TFT insulation layer 3 in a state of embedding the wire 2. The planarization layer 4 is provided with a contact hole 7 reaching the wire 2. Moreover, an ITO (transparent electrode) 5 is formed on the planarization layer 4 in a state of being connected to the wire 2 via this contact hole 7. Here, the ITO 5 is an electrode of a display device (for example, an organic EL device). Moreover, an insulation layer 8 is formed so as to cover the periphery of the ITO 5. The organic EL device may be a top emission type in which emitted light is released from the side opposite to the substrate 6 or a bottom emission type in which light is extracted from the substrate 6 side. In this manner, an active matrix type organic EL display device in which the TFTs 1 for driving the respective organic EL devices are connected to the organic EL devices is obtained.

The TFT insulation layer 3, the planarization layer 4 and/or the insulation layer 8 can be formed through a step of forming a photosensitive resin film formed of the resin composition or the resin sheet of the present invention as described above, a step of exposing the photosensitive resin film to light, a step of developing the photosensitive resin film exposed to light, and a step of subjecting the photosensitive resin film developed to a heat treatment. An organic EL display device can be obtained by a production method including these steps.

<Semiconductor Electronic Component and Semiconductor Equipment>

The semiconductor electronic component or semiconductor equipment of the present invention includes an electrode, a metal wire, an interlayer insulation layer and/or a surface protective layer on a substrate, in which the interlayer insulation layer and/or the surface protective layer are formed of the cured film of the present invention. The cured film of the present invention exhibits excellent mechanical characteristics, and it is thus possible to relieve the stress from the sealant resin even at the time of mounting, to suppress the damage of the low-k layer, and to provide a highly reliable semiconductor equipment.

Figure 2:
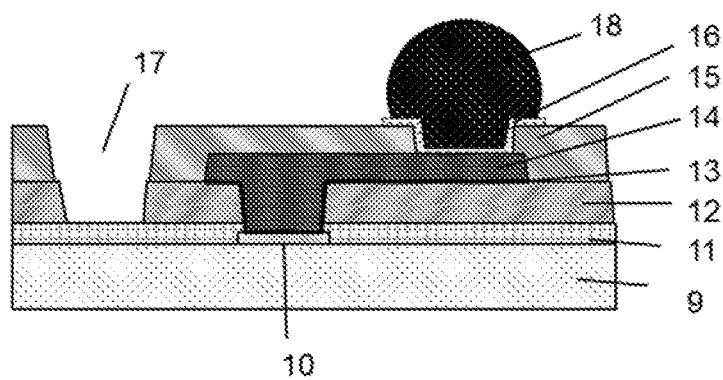
FIG. 2 is an enlarged cross-sectional view of an example of a pad portion of a semiconductor equipment including a bump.

An enlarged cross-sectional view of an example of a pad portion of a semiconductor equipment including a bump is illustrated in FIG. 2. An Al pad 10 for input and output and a passivation layer 11 having via holes are formed on a silicon wafer 9. Furthermore, an insulation layer 12 is formed on the passivation layer 11, a metal layer 13 formed of Cr, Ti and the like is further formed so as to be connected to the Al pad 10, and a metal wire 14 made of Al, Cu and the like is formed by electrolytic plating and the like. By etching the metal layer 13 located around a solder bump 18, the respective pads are insulated from each other. A barrier metal 16 and the solder bump 18 are formed on the insulated pad.

Figure 3:
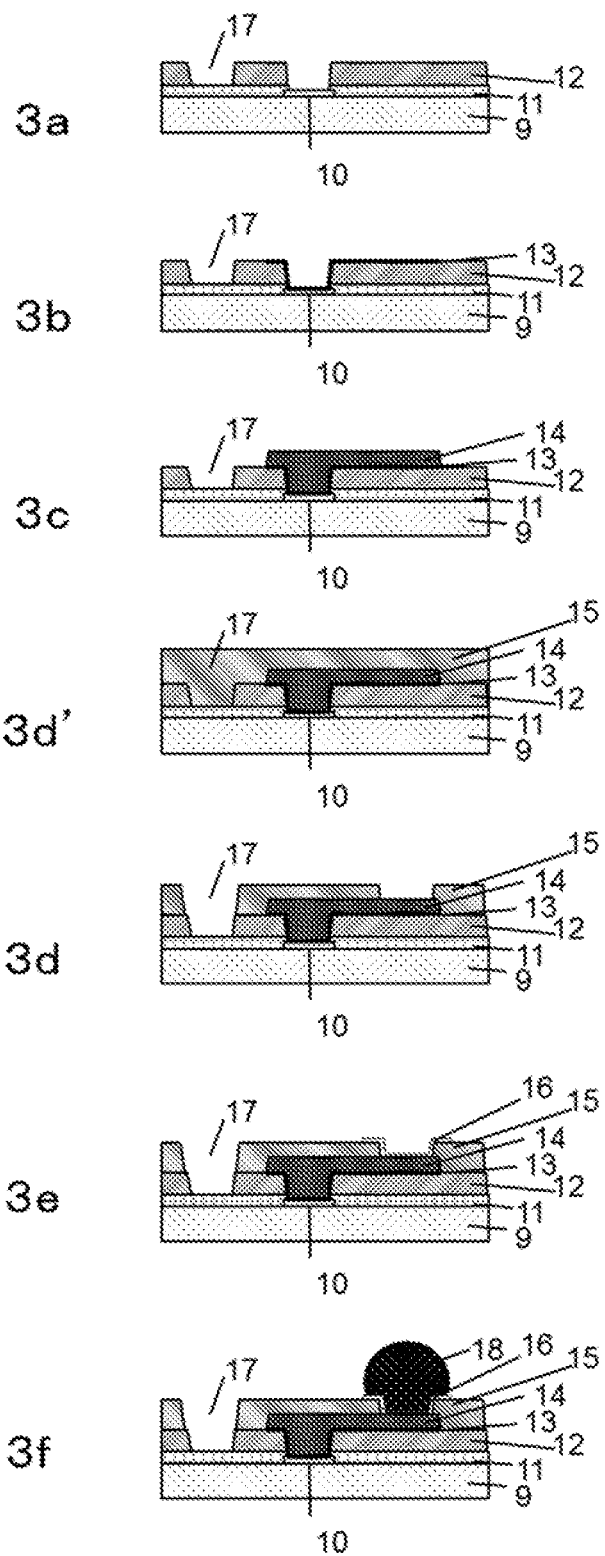
FIG. 3 is a schematic view illustrating an example of a method for producing a semiconductor equipment including a bump.

Next, a method for producing a semiconductor equipment will be described with reference to the drawings. An example of a method for producing a semiconductor equipment including a bump is illustrated in FIG. 3. In step 3a, the resin composition of the present invention is applied on the silicon wafer 9 on which the Al pad 10 and the passivation layer 11 are formed and a photolithography process is conducted to form the patterned insulation layer 12. Subsequently, in step 3b, the metal layer 13 is formed by a sputtering method. In step 3c, the metal wire 14 is formed on the metal layer 13 by a plating method. Next, the resin composition of the present invention is applied in step 3d', and a pattern of the insulation layer 15 is formed through a photolithography process in step 3d. At this time, the resin composition constituting the insulation layer 15 is processed to form a thick film in the scribe line 17. A wire (so-called rewire) can be further formed on the insulation layer 15. In the case of forming a multilayer wire structure of two or more layers, it is possible to form a multilayer wire structure in which the rewire of two or more layers is separated by the interlayer insulation layer formed of the cured film of the present invention by repeatedly conducting the above step. The number of layers of the multilayer wire structure does not have the upper limit, but a multilayer wire structure of ten or less layers is often used. Subsequently, the barrier metal 16 is formed in step 3e, and the solder bump 18 is formed in step 3f. Thereafter, dicing is conducted along the last scribe line 17 to divide each chip, and a semiconductor equipment including a bump can be thus obtained.

EXAMPLES

Hereinafter, the present invention will be described with reference to Examples and the like, but the present invention is not limited by these examples. Incidentally, the resin compositions in Examples were evaluated by the following methods.

(1) Sensitivity

The varnish obtained in each Example and Comparative Example was applied on an 8-inch silicon wafer using a coating and developing apparatus ACT-8 (manufactured by Tokyo Electron Ltd.) by a spin coating method and baked at 120° C. for 3 minutes to fabricate a prebaked film having a thickness of 3.0 μm. Incidentally, the film thickness was measured under the condition of a refractive index of 1.63 using Lambda Ace STM-602 manufactured by SCREEN Semiconductor Solutions Co., Ltd. Thereafter, exposure was conducted every 5 mJ/cm$^2$ in an exposure energy range of 50 mJ/cm$^2$ to 300 mJ/cm$^2$ via a mask having a contact hole pattern of 10 μm using an exposure machine i-line stepper NSR-2005i9C (manufactured by Nikon Corporation). After the exposure, development was conducted using a 2.38 wt % tetramethylammonium aqueous solution (hereinafter referred to as TMAH, manufactured by TTAMA ChemICAL CO., LTD.) as a developer until the film decrease amount reached 0.5 μm using the developing apparatus ACT-8, then rinsing was conducted using distilled water, and shaking off and drying were conducted, thereby obtaining a pattern.

The pattern obtained was observed under a FDP microscope MX61 (manufactured by OLYMPUS CORPORATION) at a magnification of 20-fold, and the opening diameter of the contact hole was measured. The minimum exposure energy at which the opening diameter of the contact hole reached 10 μm was determined, and this was taken as the sensitivity.

(2) Outgas

The varnish obtained in each Example and Comparative Example was applied on a 6-inch silicon wafer at an arbitrary rotation speed by a spin coating method using a spin coater (MS-A100; manufactured by Mikasa Co., Ltd.) and then prebaked at 120° C. for 120 seconds using a hot plate (SCW-636, manufactured by SCREEN Holdings Co., Ltd.) to fabricate a prebaked film having a thickness of about 3.0 μm. Incidentally, the film thickness was measured under the condition of a refractive index of 1.63 using Lambda Ace STM-602 manufactured by SCREEN Semiconductor Solutions Co., Ltd. The prebaked film obtained was heated using an inert oven CLH-21CD-S (manufactured by KOYO THERMO SYSTEMS CO., LTD.) while raising the temperature to 250° C. at an oxygen concentration of 20 ppm or less under a condition of temperature rise of 5° C./min and further heated at 250° C. for 1 hour to fabricate a cured film of the resin composition. Using helium as a purge gas, 10 mg of the cured film on a 6-inch silicon wafer obtained was heated at 180° C. for 30 minutes, and the components desorbed by the purge and trap method were collected in an adsorbent (Carbotrap 400).

The components collected were thermally desorbed at 280° C. for 5 minutes and then subjected to GC-MS analysis under the conditions of a column temperature: 40° C. to 300° C., a carrier gas: helium (1.5 mL/min), and a scanning range: m/Z=29 to 600 using a GC-MS apparatus 6890/5973N (manufactured by Agilent). The amount of gas generated was calculated from the calibration curve created through GC-MS analysis under the same conditions as the above using n-hexadecane as a standard substance.

(3) 5% Weight Loss Temperature

A cured film of a resin composition was fabricated on a 6-inch silicon wafer by the same method as in (2) so that the film thickness after curing was 10 μm and peeled off from the wafer by immersing the wafer in 45 wt % hydrofluoric acid for 5 minutes. The cured film obtained was thoroughly washed with pure water and then dried in an oven at 60° C. for 5 hours to obtain a film. In thermogravimetric analyzer TGA-50 (manufactured by Shimadzu Corporation), 10 mg of the film obtained was placed, the temperature thereof was raised from room temperature to 100° C. in a nitrogen atmosphere, the film was then further held at 100° C. for 30 minutes, and the weight thereof was measured. Thereafter, the weight was measured while raising the temperature to 400° C. under a condition of a rate of temperature rise of 10° C./min, and the temperature at the time point at which the weight of the film was decreased by 5% with respect to the weight of the film after being held at 100° C. for 30 minutes was measured.

(4) Chemical Resistance

A cured film of a resin composition was fabricated on a 6-inch silicon wafer by the same method as in (2) so that the film thickness after curing was 2 μm, the thickness thereof was measured, and then the cured film was immersed in a mixed solution of 2-(2-aminoethoxy)ethanol/NMP/NMF/DMAc=10/15/30/50 (weight ratio) at 60° C. for 30 seconds. The cured film taken out from the mixed solution was washed with pure water and then heated while raising the temperature to 250° C. at an oxygen concentration of 20 ppm or less under a condition of temperature rise of 5° C./min using a high-temperature inert gas oven (INH-9CD-S; manufactured by KOYO THERMO SYSTEMS CO., LTD.) and then baked again at 250° C. for 1 hour. The film thickness was measured again, and the absolute value of the percentage of the amount of change in film thickness after re-baking with respect to the film thickness before immersion in the solution was calculated.

(5) Evaluation on Long-Term Reliability of Organic EL Display Device

Figure 4:
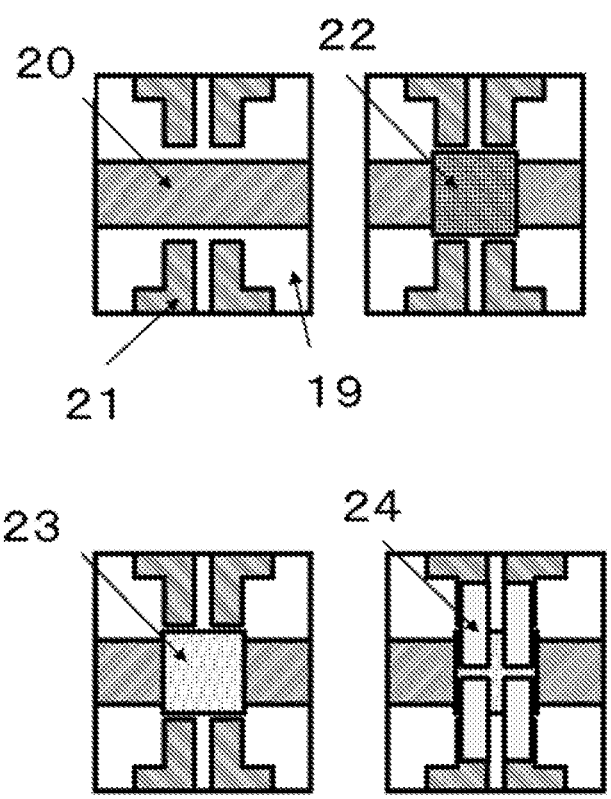
FIG. 4 is a schematic view of a fabrication procedure of an organic EL display device in Examples.

A schematic view of a fabrication procedure of an organic EL display device is illustrated in FIG. 4. First, an ITO transparent conductive film of 10 nm was formed on the entire surface of a 38 mmmm×46 mm non-alkali glass substrate 19 by a sputtering method and etched as a first electrode (transparent electrode) 20. At the same time, an auxiliary electrode 21 for taking out the second electrode was also formed. The substrate obtained was subjected to ultrasonic cleaning using "Semicoclean" (registered trademark) 56 (trade name, manufactured by Furuuchi Chemical Corporation) for 10 minutes and washed with ultrapure water. Next, the photosensitive resin composition presented in Table 1 or 2 was applied on the entire surface of this substrate by a spin coating method and prebaked on a hot plate at 120° C. for 2 minutes. This film was exposed to UV via a photomask, then developed using a 2.38 mass % TMAH aqueous solution to dissolve unnecessary portions, and rinsed with pure water. The resin pattern obtained was subjected to a heat treatment at 250° C. for 1 hour in a nitrogen atmosphere using a high-temperature inert gas oven (INH-9CD-S; manufactured by KOYO THERMO SYSTEMS CO., LTD.). In this manner, an insulation layer 22 in which opening portions of 70 μm in width and 260 μm in length were disposed with a pitch of 155 μm in a width direction and a pitch of 465 μm in a length direction and the respective opening portions exposed the first electrodes was formed exclusively in the effective area of substrate. In this manner, an insulation layer having an insulation layer opening ratio of 25% was formed in the effective area of substrate having a square shape with one side of 16 mm. The thickness of the insulation layer was about 1.0 μm.

Next, a nitrogen plasma treatment was conducted as a pretreatment, and an organic EL layer 23 including a light-emitting layer was formed by a vacuum vapor deposition method. Incidentally, the degree of vacuum at the time of vapor deposition was 1×10⁻³ Pa or less, and the substrate was rotated with respect to a vapor deposition source during the vapor deposition. First, a compound (HT-1) was vapor deposited by 10 nm as a positive hole injection layer, and a compound (HT-2) was vapor deposited by 50 nm as a positive hole transport layer. Next, a compound (GH-1) as a host material and a compound (GD-1) as a dopant material were vapor deposited on the light-emitting layer in a thickness of 40 nm so that the dope concentration was 10%. Next, a compound (ET-1) and a compound (LiQ) as electron transporting materials were laminated in a thickness of 40 nm at a volume ratio of 1:1. The structures of the compounds used in the organic EL layer are presented below.

[Chem. 15]

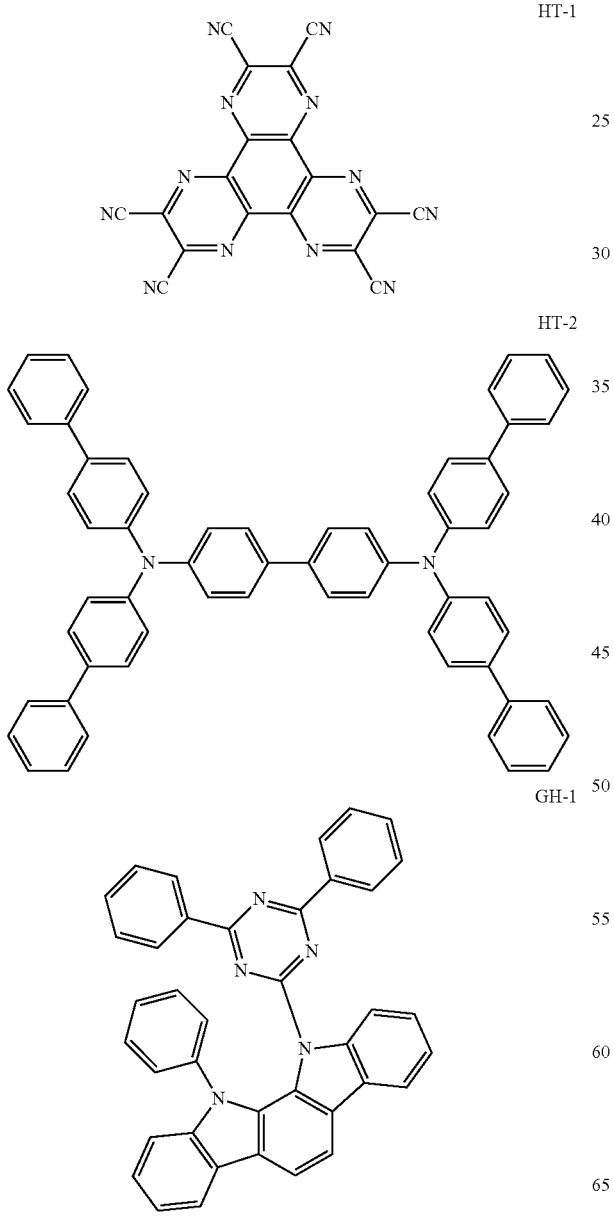

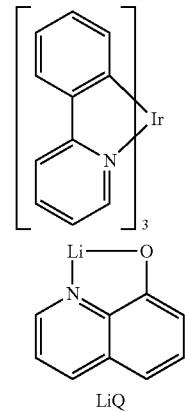

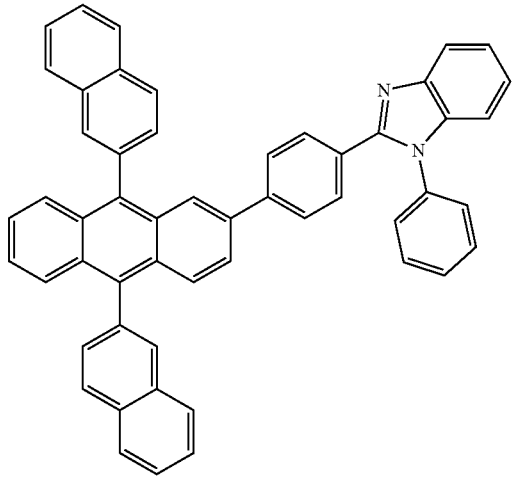

Next, a compound (LiQ) was vapor deposited by 2 nm and then Mg and Ag were vapor deposited thereon at a volume ratio of 10:1 by 10 nm to fabricate a second electrode (non-transparent electrode) 24. Finally, sealing was conducted by pasting a cap-like glass plate thereonto using an epoxy resin-based adhesive in a low-humidity nitrogen atmosphere, whereby four top emission type organic EL display devices each having a rectangular shape with one side of 5 mm were fabricated on one substrate. Incidentally, the film thickness referred to here is a display value on a crystal oscillation type film thickness monitor.

The organic EL display device fabricated was placed on a hot plate heated to 80° C. with the light-emitting side up and irradiated with UV light having a wavelength of 365 nm and an illuminance of 0.6 mW/cm². Immediately after the irradiation (0 hour) and after the elapse of 250 hours, 500 hours, and 1000 hours, the organic EL display device was allowed to emit light by direct current drive of 0.625 mA, and the area ratio of the light-emitting portion to the area of the light-emitting pixel (pixel light-emitting area ratio) was measured. It can be said that the long-term reliability is excellent when the pixel light-emitting area ratio after the elapse of 1000 hours by this evaluation method is 80% or more, and it is more preferable when the pixel light-emitting area ratio is 90% or more.

(6) Weight Average Molecular Weight and Modification Rate of Alkali-Soluble Resin The weight average molecular weight (Mw) of the resins obtained in Synthesis Examples 6 to 16 in terms of polystyrene was measured using a GPC (gel permeation chromatography) apparatus Waters 2690-996 (manufactured by Nihon Waters K.K.) and using N-methyl-2-pyrrolidone (hereinafter referred to as NMP) as an eluent.

In addition, the modification rate of the resins obtained in Synthesis Examples 6 to 16 was determined from the proportion (mol %) of the number of moles of the reacted primary amine to the number of moles of the phenolic hydroxyl group derived from a hydroxystyrene resin or a phenolic resin. The number of moles of the phenolic hydroxyl group derived from a hydroxystyrene resin or a phenolic resin was determined by multiplying the proportion of the number of moles of the aromatic compound having a phenolic hydroxyl group in the aromatic compound used in the synthesis of the hydroxystyrene resin or the phenolic resin by the sum of the number of moles of the repeating units of the hydroxystyrene resin or the phenolic resin. The sum of the number of moles of the repeating units of the hydroxystyrene resin or the phenolic resin was determined by determining the equivalents of the amounts of substances (moles) of the respective repeating units by dividing the masses of the respective repeating units constituting the hydroxystyrene resin or the phenolic resin by the formula weights of the respective repeating units and summing these. The number of moles of the benzoxazine ring was determined from the number of moles of the primary amine reacted with the hydroxystyrene resin or the phenolic resin.

Synthesis Example 1 Synthesis of Hydroxyl Group-Containing Diamine Compound (a)

In 100 mL of acetone and 17.4 g (0.3 mole) of propylene oxide, 18.3 g (0.05 mole) of 2,2-bis(3-amino-4-hydroxyphenyl)hexafluoropropane (hereinafter referred to as BAHF) was dissolved and the solution was cooled to −15° C. A solution prepared by dissolving 20.4 g (0.11 mole) of 3-nitrobenzoyl chloride in 100 mL of acetone was add thereto dropwise. After completion of the dropwise addition, the mixture was allowed to react at −15° C. for 4 hours, and then the temperature was returned to room temperature. The white solid precipitated was separated by filtration and vacuum-dried at 50° C.

In a 300 mL stainless steel autoclave, 30 g of the solid was placed and dispersed in 250 mL of Methyl Cellosolve, and 2 g of 5% palladium-carbon was added thereto. Hydrogen was introduced thereinto as a balloon and the reduction reaction was conducted at room temperature. After about 2 hours, it was confirmed that the balloon did not deflate anymore, and the reaction was terminated. After the termination of the reaction, a palladium compound as a catalyst was removed by filtration, and the mixture was concentrated using a rotary evaporator, thereby obtaining a hydroxyl group-containing diamine compound (α) represented by the following formula.

[Chem. 16]

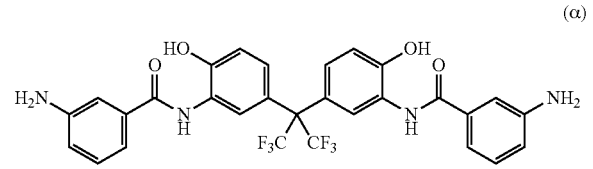

(α)

Synthesis Example 2 Synthesis of Alkali-Soluble Resin (a-1)

In a dry nitrogen stream, 44.4 g (0.10 mole) of 4,4'-(hexafluoroisopropylidene)diphthalic dianhydride (hereinafter referred to as 6FDA) was dissolved in 500 g of NMP. Thereto, 4.46 g (0.05 mole) of 3-aminophenol as an end-capping agent was added together with 5 g of NMP, and the mixture was allowed to react at 40° C. for 30 minutes. Thereto, 30.2 g (0.05 mole) of the hydroxyl group-containing diamine compound (a) obtained in Synthesis Example 1, 7.32 g (0.02 mole) of BAHF, and 1.24 g (0.005 mole) of 1,3-bis(3-aminopropyl)tetramethyldisiloxane were added together with 50 g of NMP, and the mixture was allowed to react at 40° C. for 2 hours. Thereafter, a solution prepared by diluting 28.6 g (0.24 mole) of N,N-dimethylformamide dimethyl acetal with 50 g of NMP was added thereto dropwise over 10 minutes. After the dropwise addition, the mixture was stirred at 40° C. for 3 hours. After completion of the stirring, the solution was cooled to room temperature and then poured into 3 L of water to obtain a white precipitate. This precipitate was collected by filtration, washed with water three times, and then dried in a vacuum dryer at 80° C. for 24 hours, thereby obtaining polyimide precursor (a-1) which was an alkali-soluble resin.

Synthesis Example 3 Synthesis of Alkali-Soluble Resin (a-2)

In a dry nitrogen stream, 29.3 g (0.08 mole) of BAHF, 1.24 g (0.005 mole) of 1,3-bis(3-aminopropyl)tetramethyldisiloxane, and 3.27 g (0.03 mole) of 3-aminophenol as an end-capping agent were dissolved in 150 g of NMP. Thereto, 31.0 g (0.1 mole) of 3,3',4,4'-diphenyl ether tetracarboxylic dianhydride (hereinafter referred to as ODPA) was added together with 50 g of NMP, and the mixture was stirred at 20° C. for 1 hour and then stirred at 50° C. for 4 hours. Thereafter, 15 g of xylene was added thereto, and the mixture was stirred at 150° C. for 5 hours while the azeotropy of water with xylene was allowed to occur. After completion of the stirring, the solution was poured into 3 L of water and a white precipitate was collected. This precipitate was collected by filtration, washed with water three times, and then dried in a vacuum dryer at 80° C. for 24 hours, thereby obtaining polyimide (a-2) which was an alkali-soluble resin.

Synthesis Example 4 Synthesis of Alkali-Soluble Resin (a-3)

In a dry nitrogen stream, 18.3 g (0.05 mole) of BAHF was dissolved in 50 g of NMP and 26.4 g (0.3 mole) of glycidyl methyl ether, and the temperature of the solution was lowered to −15° C. A solution prepared by dissolving 7.4 g (0.025 mole) of diphenyl ether dicarboxylic acid dichloride (manufactured by NIPPON NOHYAKU CO., LTD.) and 5.1 g (0.025 mole) of isophthalic acid chloride (manufactured by TOKYO ChemICAL INDUSTRY CO., LTD.) in 25 g of γ-butyrolactone (GBL) was added thereto dropwise so that the internal temperature did not exceed 0° C. After completion of the dropwise addition, stirring was continuously conducted at −15° C. for 6 hours. After completion of the reaction, the solution was poured into 3 L of water containing methanol at 10 wt % and a white precipitate was collected. This precipitate was collected by filtration, washed with water three times, and then dried in a vacuum dryer at 80° C. for 24 hours, thereby obtaining polybenzoxazole precursor (a-3) which was an alkali-soluble resin.

Synthesis Example 5 Synthesis of Alkali-Soluble Resin (a'-4)

In a 500 ml flask, 5 g of 2,2'-azobis(isobutyronitrile), 5 g of t-dodecanethiol, and 150 g of propylene glycol monomethyl ether acetate (hereinafter abbreviated as PGMEA) were placed. Thereafter, 30 g of methacrylic acid, 35 g of benzyl methacrylate, and 35 g of tricyclo[5.2.1.0$^{2,6}$]decan-8-yl methacrylate were added thereto, the mixture was stirred for a while at room temperature, the interior of the flask was purged with nitrogen, and the mixture was heated and stirred at 70° C. for 5 hours. Next, 15 g of glycidyl methacrylate, 1 g of dimethylbenzylamine, and 0.2 g of p-methoxyphenol were added to the solution obtained, and the mixture was heated and stirred at 90° C. for 4 hours, thereby obtaining a solution of an acrylic resin (a'-4) which was an alkali-soluble resin. The solid concentration of the acrylic resin solution obtained was 43 wt %.

Synthesis Example 6 Synthesis of Hydroxystyrene Resin (1)

To a mixed solution of 500 ml of tetrahydrofuran and 0.64 g (0.01 mole) of sec-butyllithium as an initiator, 132.2 g (0.75 mole) of p-t-butoxystyrene and 26.0 g (0.25 mole) of styrene were added, and polymerization was conducted wile stirring the mixture for 3 hours. Thereafter, 0.1 mole of methanol was added to the reaction solution to stop the polymerization reaction. The reaction mixture obtained was poured into methanol and the polymer precipitated was dried, thereby obtaining a white polymer. The white polymer obtained was dissolved in 400 ml of acetone, a small amount of concentrated hydrochloric acid was added thereto at 60° C., the mixture was stirred for 7 hours and then poured into water to precipitate a polymer, the p-t-butoxystyrene was deprotected and converted into hydroxystyrene. The reaction product obtained was washed and dried, thereby obtaining a purified hydroxystyrene resin (1). The weight average molecular weight of the hydroxystyrene resin (1) obtained was 3,500. The proportion of the number of moles of the aromatic compound having a phenolic hydroxyl group in the aromatic compound was 75%.

Synthesis Example 7 Synthesis of Hydroxystyrene Resin (2)

A hydroxystyrene resin (2) was obtained in the same manner as in Synthesis Example 6 except that styrene was not added. The weight average molecular weight of the hydroxystyrene resin (2) obtained was 3,000. The proportion of the number of moles of the aromatic compound having a phenolic hydroxyl group in the aromatic compound was 100%.

Synthesis Example 8 Synthesis of Novolac Resin (3)

In a dry nitrogen stream, 70.2 g (0.65 mole) of m-cresol, 37.8 g (0.35 mole) of p-cresol, 75.5 g (formaldehyde: 0.93 mole) of 37 mass % formaldehyde aqueous solution, 0.63 g (0.005 mole) of oxalic dihydrate, and 264 g of methyl isobutyl ketone were placed in a 500 ml flask, and then the flask was immersed in an oil bath, and polycondensation reaction was conducted for 7 hours while refluxing the reaction solution. Thereafter, the temperature of the oil bath was lowered to room temperature over 3 hours, the internal pressure of the flask was decreased to 40 to 67 hPa to remove volatile components, the resin dissolved was cooled to room temperature, and GBL was added thereto, thereby obtaining a solution of a novolac resin (3) which was an alkali-soluble resin and in which the solid concentration was adjusted to 50 wt %. The weight average molecular weight of the novolac resin (3) obtained was 7,000. The proportion of the number of moles of the aromatic compound having a phenolic hydroxyl group in the aromatic compound was 100%.

Synthesis Example 9 Synthesis of Benzoxazine-Modified Hydroxystyrene Resin (b1-1)

To a solution prepared by dissolving 77.4 g of the hydroxystyrene resin (1) obtained in Synthesis Example 6 in 140 g of methyl isobutyl ketone, 4.7 g (0.05 mole) of aniline and 3.3 g (0.1 mole) of 92 wt % paraformaldehyde were added, and then the mixture was heated and stirred at 90° C. for 6 hours. This solution was subjected to solvent substitution using ethyl lactate, thereby obtaining a solution of a benzoxazine-modified hydroxystyrene resin (b1-1) having a solid concentration of 30 wt %. The benzoxazine-modified hydroxystyrene resin (b1-1) contains structural units represented by the general formulas (2), (4) and (5). The weight average molecular weight of the benzoxazine-modified hydroxystyrene resin (b1-1) obtained was 4,000. The proportion of the number of moles of an aromatic compound having a phenolic hydroxyl group in the aromatic compound used in the synthesis of the hydroxystyrene resin (1) was 75%, the sum of the number of moles of the repeating units of the hydroxystyrene resin (1) was 0.66 mole, the number of moles of the primary amine reacted with the hydroxystyrene resin was 0.05 mole, and thus the modification rate was 10%.

Synthesis Example 10 Synthesis of Benzoxazine-Modified Hydroxystyrene Resin (b1-2)

A 30 wt % ethyl lactate solution of a benzoxazine-modified hydroxystyrene resin (b1-2) was obtained in the same manner as in Synthesis Example 9 except that 60.1 g of the hydroxystyrene resin (2) obtained in Synthesis Example 7 was used instead of 74.8 g of the hydroxystyrene resin (1) obtained in Synthesis Example 6. The benzoxazine-modified hydroxystyrene resin (b1-2) contains structural units represented by the general formulas (2) and (4). The weight average molecular weight of the benzoxazine-modified hydroxystyrene resin (b1-2) obtained was 3,400. The proportion of the number of moles of an aromatic compound having a phenolic hydroxyl group in the aromatic compound used in the synthesis of the hydroxystyrene resin (2) was 100%, the sum of the number of moles of the repeating units of the hydroxystyrene resin (2) was 0.5 mole, the number of moles of the primary amine reacted with the hydroxystyrene resin was 0.05 mole, and thus the modification rate was 10%.

Synthesis Example 11 Synthesis of Benzoxazine-Modified Hydroxystyrene Resin (b1-3)

A 30 wt % ethyl lactate solution of a benzoxazine-modified hydroxystyrene resin (b1-3) was obtained in the same manner as in Synthesis Example 9 except that 4.7 g (0.05 mole) of aniline was changed to 2.3 g (0.025 mole) and 3.3 g (0.1 mole) of 92 wt % paraformaldehyde was changed to 1.6 g (0.05 mole). The benzoxazine-modified hydroxystyrene resin (b1-3) contains structural units represented by the general formulas (2), (4) and (5). The weight average molecular weight of the benzoxazine-modified hydroxystyrene resin (b1-3) obtained was 3,700. The proportion of the number of moles of an aromatic compound having a phenolic hydroxyl group in the aromatic compound used in the synthesis of the hydroxystyrene resin (1) was 75%, the sum of the number of moles of the repeating units of the hydroxystyrene resin was 0.66 mole, the number of moles of the primary amine reacted with the hydroxystyrene resin was 0.025 mole, and thus the modification rate was 5%.

Synthesis Example 12 Synthesis of Benzoxazine-Modified Hydroxystyrene Resin (b1-4)

A 30 wt % ethyl lactate solution of a benzoxazine-modified hydroxystyrene resin (b1-4) was obtained in the same manner as in Synthesis Example 9 except that 4.7 g (0.05 mole) of aniline was changed to 9.3 g (0.10 mole) and 3.3 g (0.1 mole) of 92 wt % paraformaldehyde was changed to 6.5 g (0.2 mole). The benzoxazine-modified hydroxystyrene resin (b1-4) contains structural units represented by the general formulas (2), (4) and (5). The weight average molecular weight of the benzoxazine-modified hydroxystyrene resin (b1-4) obtained was 4,200. The proportion of the number of moles of an aromatic compound having a phenolic hydroxyl group in the aromatic compound used in the synthesis of the hydroxystyrene resin (1) was 75%, the sum of the number of moles of the repeating units of the hydroxystyrene resin was 0.66 mole, the number of moles of the primary amine reacted with the hydroxystyrene resin was 0.10 mole, and thus the modification rate was 20%.

Synthesis Example 13 Synthesis of Benzoxazine-Modified Hydroxystyrene Resin (b1-5)

A 30 wt % ethyl lactate solution of a benzoxazine-modified hydroxystyrene resin (b1-5) was obtained in the same manner as in Synthesis Example 9 except that 4.7 g (0.05 mole) of aniline was changed to 2.3 g (0.025 mole) and 3.4 g (0.025 mole) of m-aminobenzoic acid was used. The benzoxazine-modified hydroxystyrene resin (b1-5) contains structural units represented by the general formulas (2), (4) and (5). The weight average molecular weight of the benzoxazine-modified hydroxystyrene resin (b1-5) obtained was 4,100. The proportion of the number of moles of an aromatic compound having a phenolic hydroxyl group in the aromatic compound used in the synthesis of the hydroxystyrene resin (1) was 75%, the sum of the number of moles of the repeating units of the hydroxystyrene resin (1) was 0.66 mole, the number of moles of the primary amine reacted with the hydroxystyrene resin was 0.05 mole, and thus the modification rate was 10%.

Synthesis Example 14 Synthesis of Benzoxazine-Modified Hydroxystyrene Resin (b1-6)

A 30 wt % ethyl lactate solution of a benzoxazine-modified hydroxystyrene resin (b1-6) was obtained in the same manner as in Synthesis Example 9 except that 2.3 g (0.05 mole) of ethylamine was used instead of 4.7 g (0.05 mole) of aniline. The benzoxazine-modified hydroxystyrene resin (b1-6) contains structural units represented by the general formulas (2), (4) and (5). The weight average molecular weight of the benzoxazine-modified hydroxystyrene resin (b1-6) obtained was 3,800. The proportion of the number of moles of an aromatic compound having a phenolic hydroxyl group in the aromatic compound used in the synthesis of the hydroxystyrene resin (1) was 75%, the sum of the number of moles of the repeating units of the hydroxystyrene resin (1) was 0.66 mole, the number of moles of the primary amine reacted with the hydroxystyrene resin was 0.05 mole, and thus the modification rate was 10%.

Synthesis Example 15 Synthesis of Benzoxazine-Modified Novolac Resin (b2-1)

A 30 wt % ethyl lactate solution of a benzoxazine-modified novolac resin (b2-1) was obtained in the same manner as in Synthesis Example 9 except that 54.1 g of the novolac resin (3) obtained in Synthesis Example 8 was used instead of 74.8 g of the hydroxystyrene resin (1) obtained in Synthesis Example 6. The benzoxazine-modified hydroxystyrene resin (b2-1) contains structural units represented by the general formulas (3) and (6). The weight average molecular weight of the resin obtained was 7,700. The proportion of the number of moles of an aromatic compound having a phenolic hydroxyl group in the aromatic compound used in the synthesis of the novolac resin (3) was 100%, the sum of the number of moles of the repeating units of the novolac resin (3) was 0.5 mole, the number of moles of the primary amine reacted with the novolac resin was 0.05 mole, and thus the modification rate was 10%.

Synthesis Example 16 Synthesis of Benzoxazine-Modified Novolac Resin (b2-2)

A 30 wt % ethyl lactate solution of a benzoxazine-modified novolac resin (b2-2) was obtained in the same manner as in Synthesis Example 15 except that 4.7 g (0.05 mole) of aniline was changed to 2.3 g (0.025 mole) and 3.3 g (0.1 mole) of 92 wt % paraformaldehyde was changed to 1.6 g (0.05 mole). The benzoxazine-modified novolac resin (b2-2) contains structural units represented by the general formulas (3) and (6). The weight average molecular weight of the benzoxazine-modified novolac resin (b2-3) obtained was 7,100. The proportion of the number of moles of an aromatic compound having a phenolic hydroxyl group in the aromatic compound used in the synthesis of the novolac resin (3) was 100%, the sum of the number of moles of the repeating units of the novolac resin (3) was 0.5 mole, the number of moles of the primary amine reacted with the novolac resin was 0.025 mole, and thus the modification rate was 5%.

Synthesis Example 17 Synthesis of Benzoxazine-Modified Novolac Resin (b2-3)

A 30 wt % ethyl lactate solution of a benzoxazine-modified novolac resin (b2-3) was obtained in the same manner as in Synthesis Example 15 except that 4.7 g (0.05 mole) of aniline was changed to 9.3 g (0.1 mole) and 3.3 g (0.1 mole) of 92 wt % paraformaldehyde was changed to 6.5 g (0.2 mole). The benzoxazine-modified novolac resin (b2-3) contains structural units represented by the general formulas (3) and (6). The weight average molecular weight of the benzoxazine-modified novolac resin (b2-3) obtained was 8,000. The proportion of the number of moles of an aromatic compound having a phenolic hydroxyl group in the aromatic compound used in the synthesis of the novolac resin (3) was 100%, the sum of the number of moles of the repeating units of the novolac resin (3) was 0.5 mole, the number of moles of the primary amine reacted with the novolac resin was 0.1 mole, and thus the modification rate was 20%.

Synthesis Example 18 Synthesis of Benzoxazine-Modified Novolac Resin (b2-4)

A 30 wt % ethyl lactate solution of a benzoxazine-modified novolac resin (b2-4) was obtained in the same manner as in Synthesis Example 15 except that 4.7 g (0.05 mole) of aniline was changed to 18.6 g (0.2 mole) and 3.3 g (0.1 mole) of 92 wt % paraformaldehyde was changed to 13.1 g (0.4 mole). The benzoxazine-modified novolac resin (b2-4) contains structural units represented by the general formulas (3) and (6). The weight average molecular weight of the benzoxazine-modified novolac resin (b2-4) obtained was 8,200. The proportion of the number of moles of an aromatic compound having a phenolic hydroxyl group in the aromatic compound used in the synthesis of the novolac resin (3) was 100%, the sum of the number of moles of the repeating units of the novolac resin (3) was 0.5 mole, the number of moles of the primary amine reacted with the novolac resin was 0.2 mole, and thus the modification rate was 40%.

Synthesis Example 19 Synthesis of Benzoxazine-Modified Novolac Resin (b2-5)

A 30 wt % ethyl lactate solution of a benzoxazine-modified novolac resin (b2-5) was obtained in the same manner as in Synthesis Example 15 except that 4.7 g (0.05 mole) of aniline was changed to 27.9 g (0.3 mole) and 3.3 g (0.1 mole) of 92 wt % paraformaldehyde was changed to 19.6 g (0.6 mole). The benzoxazine-modified novolac resin (b2-5) contains structural units represented by the general formulas (3) and (6). The weight average molecular weight of the benzoxazine-modified novolac resin (b2-5) obtained was 8,400. The proportion of the number of moles of an aromatic compound having a phenolic hydroxyl group in the aromatic compound used in the synthesis of the novolac resin (3) was 100%, the sum of the number of moles of the repeating units of the novolac resin (3) was 0.5 mole, the number of moles of the primary amine reacted with the novolac resin was 0.3 mole, and thus the modification rate was 60%.

Synthesis Example 20 Synthesis of Alkali-Soluble Resin (b')

In a solution prepared by dissolving 80 g (2.0 mole) of sodium hydroxide in 800 g of pure water, 100 g of the hydroxystyrene resin (1) obtained in Synthesis Example 6 was dissolved. After the hydroxystyrene resin (1) was completely dissolved, 686 g of 36 to 38 wt % formalin aqueous solution was added thereto dropwise at 20° C. to 25° C. over 2 hours. Thereafter, the mixture was stirred at 20° C. to 25° C. for 17 hours. Thereto, 98 g of sulfuric acid and 552 g of water were added for neutralization, and the mixture was allowed to still stand for 2 days as it was. The white solid formed in the solution after still standing was washed with 100 mL of water. This white solid was vacuum-dried at 50° C. for 48 hours.

Next, the white solid obtained was dissolved in 300 mL of methanol, 2 g of sulfuric acid was added thereto, and the mixture was stirred at room temperature for 24 hours. To this solution, 15 g of an anion type ion exchange resin (Amberlyst IRA96SB manufactured by Rohm and Haas Company) was added, the mixture was stirred for 1 hour, and the ion exchange resin was removed by filtration. Thereafter, 500 mL of gamma-butyrolactone was added thereto, methanol was removed using a rotary evaporator, thereby obtaining a gamma-butyrolactone solution. The solution obtained was analyzed by NMR (GX-270, manufactured by JEOL Ltd.), and it has been found that the resin obtained was a hydroxystyrene resin (b') in which some of the phenolic hydroxyl groups of the hydroxystyrene resin (1) were alkoxylated. The weight average molecular weight of the resin obtained was 8000, and 35 mol % of hydroxystyrene was alkoxylated.

Synthesis Example 21 Synthesis of Quinone Diazide Compound (c-1)

In a dry nitrogen stream, 21.22 g (0.05 mole) of TrisP-PA (trade name, manufactured by Honshu Chemical Industry Co., Ltd.) and 36.27 g (0.135 mole) of 5-naphthoquinone diazide sulfonyl chloride were dissolved in 450 g of 1,4-dioxane, and the temperature was set to room temperature. Thereto, 15.18 g of triethylamine mixed with 50 g of 1,4-dioxane was added dropwise so that the internal temperature of the system did not reach 35° C. or more. After the dropwise addition, the mixture was stirred at 30° C. for 2 hours. The triethylamine salt was filtered, and the filtrate was poured into water. Thereafter, the precipitate formed was collected by filtration. This precipitate was dried using a vacuum drier, thereby obtaining a quinone diazide compound (c-1) represented by the following formula.

[Chem. 17]

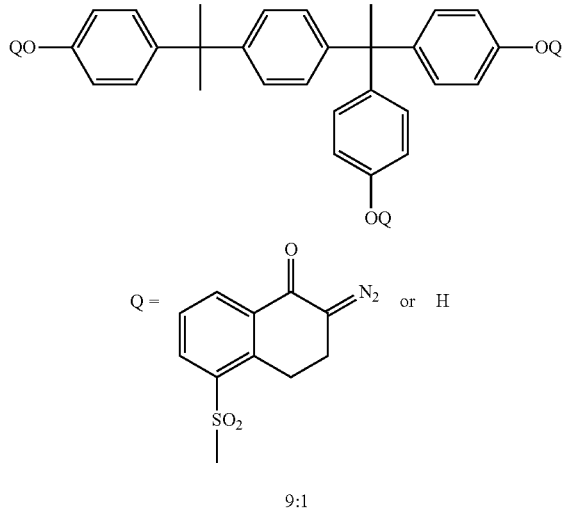

Synthesis Example 22 Synthesis of Amido-Phenol Compound (e1-1)

In 200 mL of tetrahydrofuran (THF) and 30.4 g (0.3 mole) of triethylamine, 36.3 g (0.1 mole) of bis(3-amino-4-hydroxyphenyl)hexafluoropropane (BAHF) was dissolved. A solution prepared by dissolving 38.1 g (0.2 mol) of decanoyl chloride in 100 mL of THF was added thereto dropwise at −10° C. or less. After completion of the dropwise addition, the reaction was conducted at room temperature for 4 hours. Thereafter, a 1% hydrochloric acid solution was added thereto, the reaction solution was extracted with ethyl acetate, and the solvent was removed. The solid thus obtained was vacuum-dried at 50° C., thereby obtaining an amido-phenol compound (e1-1) represented by the following formula.

[Chem. 18]

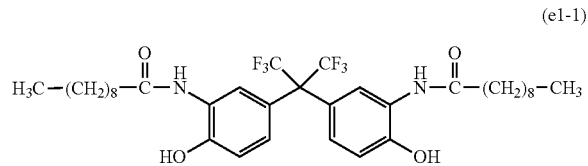

(e1-1)

Example 1

A varnish of a positive photosensitive resin composition was obtained by adding 8.0 g of the alkali-soluble resin (a-1), 2.0 g of the benzoxazine-modified hydroxystyrene resin (b1-1), and 2.0 g of the quinone diazide compound (c-1) to 30 g of GBL. As described above, the sensitivity, outgas, 5% weight loss temperature, chemical resistance, and long-term reliability of the organic EL display device were evaluated using the varnish obtained.

Example 2

A varnish of a positive photosensitive resin composition was obtained in the same manner as in Example 1 except that 2.0 g of benzoxazine-modified hydroxystyrene resin (b1-2) was used instead of 2.0 g of benzoxazine-modified hydroxystyrene resin (b1-1). As described above, the sensitivity, outgas, 5% weight loss temperature, chemical resistance, and long-term reliability of the organic EL display device were evaluated using the varnish obtained.

Example 3

A varnish of a positive photosensitive resin composition was obtained in the same manner as in Example 1 except that 2.0 g of benzoxazine-modified hydroxystyrene resin (b1-3) was used instead of 2.0 g of benzoxazine-modified hydroxystyrene resin (b1-1). As described above, the sensitivity, outgas, 5% weight loss temperature, chemical resistance, and long-term reliability of the organic EL display device were evaluated using the varnish obtained.

Example 4

A varnish of a positive photosensitive resin composition was obtained in the same manner as in Example 1 except that 2.0 g of benzoxazine-modified hydroxystyrene resin (b1-4) was used instead of 2.0 g of benzoxazine-modified hydroxystyrene resin (b1-1). As described above, the sensitivity, outgas, 5% weight loss temperature, chemical resistance, and long-term reliability of the organic EL display device were evaluated using the varnish obtained.

Example 5

A varnish of a positive photosensitive resin composition was obtained in the same manner as in Example 1 except that 2.0 g of benzoxazine-modified hydroxystyrene resin (b1-5) was used instead of 2.0 g of benzoxazine-modified hydroxystyrene resin (b1-1). As described above, the sensitivity, outgas, 5% weight loss temperature, chemical resistance, and long-term reliability of the organic EL display device were evaluated using the varnish obtained.

Example 6

A varnish of a positive photosensitive resin composition was obtained in the same manner as in Example 1 except that 2.0 g of benzoxazine-modified hydroxystyrene resin (b1-6) was used instead of 2.0 g of benzoxazine-modified hydroxystyrene resin (b1-1). As described above, the sensitivity, outgas, 5% weight loss temperature, chemical resistance, and long-term reliability of the organic EL display device were evaluated using the varnish obtained.

Example 7

A varnish of a positive photosensitive resin composition was obtained in the same manner as in Example 1 except that 2.0 g of benzoxazine-modified novolac resin (b2-1) was used instead of 2.0 g of benzoxazine-modified hydroxystyrene resin (b1-1). As described above, the sensitivity, outgas, 5% weight loss temperature, chemical resistance, and long-term reliability of the organic EL display device were evaluated using the varnish obtained.

Example 8

A varnish of a positive photosensitive resin composition was obtained in the same manner as in Example 1 except that 8.0 g of the alkali-soluble resin (a-1) was changed to 5.0 g and 2.0 g of the benzoxazine-modified hydroxystyrene resin (b1-1) was changed to 5.0 g. As described above, the sensitivity, outgas, 5% weight loss temperature, chemical resistance, and long-term reliability of the organic EL display device were evaluated using the varnish obtained.

Example 9

A varnish of a positive photosensitive resin composition was obtained in the same manner as in Example 1 except that 8.0 g of the alkali-soluble resin (a-1) was changed to 3.0 g and 2.0 g of the benzoxazine-modified hydroxystyrene resin (b1-1) was changed to 7.0 g. As described above, the sensitivity, outgas, 5% weight loss temperature, chemical resistance, and long-term reliability of the organic EL display device were evaluated using the varnish obtained.

Example 10

A varnish of a positive photosensitive resin composition was obtained in the same manner as in Example 1 except that 8.0 g of the alkali-soluble resin (a-2) was used instead of 8.0 g of the alkali-soluble resin (a-1). As described above, the sensitivity, outgas, 5% weight loss temperature, chemical resistance, and long-term reliability of the organic EL display device were evaluated using the varnish obtained.

Example 11

A varnish of a positive photosensitive resin composition was obtained in the same manner as in Example 1 except that 8.0 g of the alkali-soluble resin (a-3) was used instead of 8.0 g of the alkali-soluble resin (a-1). As described above, the sensitivity, outgas, 5% weight loss temperature, chemical resistance, and long-term reliability of the organic EL display device were evaluated using the varnish obtained.

Example 12

A varnish of a positive photosensitive resin composition was obtained in the same manner as in Example 2 except that 8.0 g of the alkali-soluble resin (a-1) was changed to 5.0 g and 2.0 g of the benzoxazine-modified hydroxystyrene resin (b1-2) was changed to 5.0 g. As described above, the sensitivity, outgas, 5% weight loss temperature, chemical resistance, and long-term reliability of the organic EL display device were evaluated using the varnish obtained.

Example 13

A varnish of a positive photosensitive resin composition was obtained in the same manner as in Example 2 except that 8.0 g of the alkali-soluble resin (a-1) was changed to 3.0 g and 2.0 g of the benzoxazine-modified hydroxystyrene resin (b1-2) was changed to 7.0 g. As described above, the sensitivity, outgas, 5% weight loss temperature, chemical resistance, and long-term reliability of the organic EL display device were evaluated using the varnish obtained.

Example 14

A varnish of a positive photosensitive resin composition was obtained in the same manner as in Example 1 except that 2.0 g of benzoxazine-modified novolac resin (b2-2) was used instead of 2.0 g of benzoxazine-modified hydroxystyrene resin (b1-1). As described above, the sensitivity, outgas, 5% weight loss temperature, chemical resistance, and long-term reliability of the organic EL display device were evaluated using the varnish obtained.

Example 15

A varnish of a positive photosensitive resin composition was obtained in the same manner as in Example 1 except that 2.0 g of benzoxazine-modified novolac resin (b2-3) was used instead of 2.0 g of benzoxazine-modified hydroxystyrene resin (b1-1). As described above, the sensitivity, outgas, 5% weight loss temperature, chemical resistance, and long-term reliability of the organic EL display device were evaluated using the varnish obtained.

Example 16

A varnish of a positive photosensitive resin composition was obtained in the same manner as in Example 7 except that 8.0 g of the alkali-soluble resin (a-1) was changed to 5.0 g and 2.0 g of the benzoxazine-modified novolac resin (b2-1) was changed to 5.0 g. As described above, the sensitivity, outgas, 5% weight loss temperature, chemical resistance, and long-term reliability of the organic EL display device were evaluated using the varnish obtained.

Example 17

A varnish of a positive photosensitive resin composition was obtained in the same manner as in Example 7 except that 8.0 g of the alkali-soluble resin (a-1) was changed to 3.0 g and 2.0 g of the benzoxazine-modified novolac resin (b2-1) was changed to 7.0 g. As described above, the sensitivity, outgas, 5% weight loss temperature, chemical resistance, and long-term reliability of the organic EL display device were evaluated using the varnish obtained.

Example 18

A varnish of a positive photosensitive resin composition was obtained in the same manner as in Example 7 except that 1.0 g of the amido-phenol compound (e1-1) was added. As described above, the sensitivity, outgas, 5% weight loss temperature, chemical resistance, and long-term reliability of the organic EL display device were evaluated using the varnish obtained.

Example 19

A varnish of a positive photosensitive resin composition was obtained in the same manner as in Example 1 except that 2.0 g of benzoxazine-modified novolac resin (b2-4) was used instead of 2.0 g of benzoxazine-modified hydroxystyrene resin (b1-1). As described above, the sensitivity, outgas, 5% weight loss temperature, chemical resistance, and long-term reliability of the organic EL display device were evaluated using the varnish obtained.

Comparative Example 1

A varnish of a positive photosensitive resin composition was obtained by adding 10.0 g of the alkali-soluble resin (a-1) and 2.0 g of the quinone diazide compound (c-1) to 30 g of GBL. As described above, the sensitivity, outgas, 5% weight loss temperature, chemical resistance, and long-term reliability of the organic EL display device were evaluated using the varnish obtained.

Comparative Example 2

A varnish of a positive photosensitive resin composition was obtained by adding 8.0 g of the alkali-soluble resin (a-1), 2.0 g of the hydroxystyrene resin (1), and 2.0 g of the quinone diazide compound (c-1) to 30 g of GBL. As described above, the sensitivity, outgas, 5% weight loss temperature, chemical resistance, and long-term reliability of the organic EL display device were evaluated using the varnish obtained.

Comparative Example 3

A varnish of a positive photosensitive resin composition was obtained in the same manner as in Comparative Example 2 except that 2.0 g of the alkali-soluble resin (b') was used instead of 2.0 g of the hydroxystyrene resin (1). As described above, the sensitivity, outgas, 5% weight loss temperature, chemical resistance, and long-term reliability of the organic EL display device were evaluated using the varnish obtained.

Comparative Example 4

A varnish of a positive photosensitive resin composition was obtained in the same manner as in Comparative Example 1 except that 10.0 g of the benzoxazine-modified hydroxystyrene resin (b1-1) was used instead of 10.0 g of the alkali-soluble resin (a-1). As described above, the sensitivity, outgas, 5% weight loss temperature, chemical resistance, and long-term reliability of the organic EL display device were evaluated using the varnish obtained.

Comparative Example 5

A varnish of a positive photosensitive resin composition was obtained by adding 8.0 g of the alkali-soluble resin (a'-4), 2.0 g of the benzoxazine-modified hydroxystyrene resin (b1-1), and 2.0 g of the quinone diazide compound (c-1) to 30 g of GBL. As described above, the sensitivity, outgas, 5% weight loss temperature, chemical resistance, and long-term reliability of the organic EL display device were evaluated using the varnish obtained.

Comparative Example 6

A varnish of a positive photosensitive resin composition was obtained in the same manner as in Comparative Example 2 except that 2.0 g of the novolac resin (3) was used instead of 2.0 g of the hydroxystyrene resin (1). As described above, the sensitivity, outgas, 5% weight loss temperature, chemical resistance, and long-term reliability of the organic EL display device were evaluated using the varnish obtained.

Comparative Example 7

A varnish of a positive photosensitive resin composition was obtained in the same manner as in Comparative Example 1 except that 10.0 g of the benzoxazine-modified novolac resin (b2-1) was used instead of 10.0 g of the alkali-soluble resin (a-1). As described above, the sensitivity, outgas, 5% weight loss temperature, chemical resistance, and long-term reliability of the organic EL display device were evaluated using the varnish obtained.

Comparative Example 8

A varnish of a positive photosensitive resin composition was obtained in the same manner as in Comparative Example 2 except that 2.0 g of benzoxazine-modified novolac resin (b2-5) was used instead of 2.0 g of hydroxystyrene resin (1). As described above, the sensitivity, outgas, 5% weight loss temperature, chemical resistance, and long-term reliability of the organic EL display device were evaluated using the varnish obtained.

The compositions of the respective Examples and Comparative Examples are shown in Tables 1 and 2, and the evaluation results thereof are shown in Tables 3 and 4.

TABLE 1

| | Alkali-soluble resin (Kind) (Blended amount) | Alkali-soluble resin (Kind) (Blended amount) | Alkali-soluble resin Resin | Alkali-soluble resin Primary amine | Alkali-soluble resin Modification rate (mol %) | Others | Photosensitive compound (Kind) (Blended amount) | Solvent (Kind) (Blended amount) |
|---|---|---|---|---|---|---|---|---|
| Example 1 | a-1 8.0 g | b1-1 2.0 g | Hydroxystyrene resin (1) | Aniline | 10 | — — | c-1 2.0 g | GBL 30 g |
| Example 2 | a-1 8.0 g | b1-2 2.0 g | Hydroxystyrene resin (2) | Aniline | 10 | — — | c-1 2.0 g | GBL 30 g |
| Example 3 | a-1 8.0 g | b1-3 2.0 g | Hydroxystyrene resin (1) | Aniline | 5 | — — | c-1 2.0 g | GBL 30 g |
| Example 4 | a-1 8.0 g | b1-4 2.0 g | Hydroxystyrene resin (1) | Aniline | 20 | — — | c-1 2.0 g | GBL 30 g |
| Example 5 | a-1 8.0 g | b1-5 2.0 g | Hydroxystyrene resin (1) | Aniline m-aminobenzoic acid | 10 | — — — | c-1 2.0 g | GBL 30 g |
| Example 6 | a-1 8.0 g | b1-6 2.0 g | Hydroxystyrene resin (1) | Ethylamine | 10 | — — | c-1 2.0 g | GBL 30 g |
| Example 7 | a-1 8.0 g | b2-1 2.0 g | Novolac resin (3) | Aniline | 10 | — — | c-1 2.0 g | GBL 30 g |
| Example 8 | a-1 5.0 g | b1-1 5.0 g | Hydroxystyrene resin (1) | Aniline | 10 | — — | c-1 2.0 g | GBL 30 g |
| Example 9 | a-1 3.0 g | b1-1 7.0 g | Hydroxystyrene resin (1) | Aniline | 10 | — — | c-1 2.0 g | GBL 30 g |
| Example 10 | a-2 8.0 g | b1-1 2.0 g | Hydroxystyrene resin (1) | Aniline | 10 | — — | c-1 2.0 g | GBL 30 g |
| Example 11 | a-3 8.0 g | b1-1 2.0 g | Hydroxystyrene resin (1) | Aniline | 10 | — — | c-1 2.0 g | GBL 30 g |
| Example 12 | a-1 5.0 g | b1-2 5.0 g | Hydroxystyrene resin (2) | Aniline | 10 | — — | c-1 2.0 g | GBL 30 g |
| Example 13 | a-1 3.0 g | b1-2 7.0 g | Hydroxystyrene resin (2) | Aniline | 10 | — — | c-1 2.0 g | GBL 30 g |

TABLE 2

| | Alkali-soluble resin (Kind) (Blended amount) | Alkali-soluble resin (Kind) (Blended amount) | Resin | Primary amine | Modification rate (mol %) | Others | Photosensitive compound (Kind) (Blended amount) | Solvent (Kind) (Blended amount) |
|---|---|---|---|---|---|---|---|---|
| Example 14 | a-1 8.0 g | b2-2 2.0 g | Novolac resin (3) | Aniline | 5 | — | c-1 2.0 g | GBL 30 g |
| Example 15 | a-1 8.0 g | b2-3 2.0 g | Novolac resin (3) | Aniline | 20 | — | c-1 2.0 g | GBL 30 g |
| Example 16 | a-1 5.0 g | b2-1 5.0 g | Novolac resin (3) | Aniline | 10 | — | c-1 2.0 g | GBL 30 g |
| Example 17 | a-1 3.0 g | b2-1 7.0 g | Novolac resin (3) | Aniline | 10 | — | c-1 2.0 g | GBL 30 g |
| Example 18 | a-1 8.0 g | b2-1 2.0 g | Novolac resin (3) | Aniline | 10 | e1-1 1.0 g | c-1 2.0 g | GBL 30 g |
| Example 19 | a-1 8.0 g | b2-1 2.0 g | Novolac resin (3) | Aniline | 40 | — | c-1 2.0 g | GBL 30 g |
| Comparative Example 1 | a-1 10.0 g | — | — | — | — | — | c-1 2.0 g | GBL 30 g |
| Comparative Example 2 | a-1 8.0 g | 1 2.0 g | — | — | — | — | c-1 2.0 g | GBL 30 g |
| Comparative Example 3 | a-1 8.0 g | b' 2.0 g | — | — | — | — | c-1 2.0 g | GBL 30 g |
| Comparative Example 4 | — | b1-1 10.0 g | Hydroxystyrene resin (1) | Aniline | 10 | — | c-1 2.0 g | GBL 30 g |
| Comparative Example 5 | a'-4 8.0 g | b1-1 2.0 g | Hydroxystyrene resin (1) | Aniline | 10 | — | c-1 2.0 g | GBL 30 g |
| Comparative Example 6 | a-1 8.0 g | 3 2.0 g | — | — | — | — | c-1 2.0 g | GBL 30 g |
| Comparative Example 7 | — | b2-1 10.0 g | Novolac resin (3) | Aniline | 10 | — | c-1 2.0 g | GBL 30 g |
| Comparative Example 8 | a-1 8.0 g | b2-1 2.0 g | Novolac resin (3) | Aniline | 60 | — | c-1 2.0 g | GBL 30 g |

TABLE 3

| | Sensitivity (mJ/m$^2$) | Outgas of cured film (ppm) | 5% weight loss temperature (° C.) | Chemical resistance | Light emission reliability Pixel light-emitting area ratio "%" | | | |
|---|---|---|---|---|---|---|---|---|
| | | | | | 0 hr | 250 hr | 500 hr | 1000 hr |
| Example 1 | 140 | 3 | 330 | 2% | 100 | 98 | 94 | 86 |
| Example 2 | 120 | 3 | 330 | 2% | 100 | 98 | 94 | 86 |
| Example 3 | 120 | 5 | 320 | 3% | 100 | 96 | 90 | 80 |
| Example 4 | 165 | 3 | 335 | 1% | 100 | 98 | 94 | 86 |
| Example 5 | 145 | 4 | 325 | 2% | 100 | 98 | 94 | 86 |
| Example 6 | 135 | 4 | 320 | 2% | 100 | 98 | 92 | 84 |
| Example 7 | 130 | 3 | 335 | 2% | 100 | 100 | 98 | 96 |
| Example 8 | 120 | 3 | 315 | 2% | 100 | 98 | 94 | 86 |
| Example 9 | 120 | 4 | 310 | 1% | 100 | 94 | 88 | 80 |
| Example 10 | 170 | 3 | 335 | 2% | 100 | 100 | 98 | 94 |
| Example 11 | 145 | 3 | 330 | 2% | 100 | 96 | 92 | 82 |
| Example 12 | 120 | 3 | 320 | 2% | 100 | 98 | 94 | 86 |
| Example 13 | 115 | 4 | 315 | 1% | 100 | 96 | 88 | 80 |

TABLE 4

| | Sensitivity (mJ/m$^2$) | Outgas of cured film (ppm) | 5% weight loss temperature (° C.) | Chemical resistance | Light emission reliability Pixel light-emitting area ratio "%" | | | |
|---|---|---|---|---|---|---|---|---|
| | | | | | 0 hr | 250 hr | 500 hr | 1000 hr |
| Example 14 | 120 | 5 | 330 | 3% | 100 | 98 | 94 | 90 |
| Example 15 | 150 | 3 | 340 | 1% | 100 | 100 | 100 | 98 |
| Example 16 | 125 | 3 | 320 | 2% | 100 | 100 | 96 | 92 |
| Example 17 | 120 | 4 | 310 | 1% | 100 | 98 | 94 | 88 |

TABLE 4-continued

| | Sensitivity (mJ/m²) | Outgas of cured film (ppm) | 5% weight loss temperature (° C.) | Chemical resistance | Light emission reliability Pixel light-emitting area ratio "%" | | | |
|---|---|---|---|---|---|---|---|---|
| | | | | | 0 hr | 250 hr | 500 hr | 1000 hr |
| Example 18 | 115 | 3 | 325 | 3% | 100 | 100 | 98 | 96 |
| Example 19 | 180 | 3 | 345 | 1% | 98 | 96 | 92 | 80 |
| Comparative Example 1 | 170 | 3 | 335 | 4% | 100 | 96 | 90 | 80 |
| Comparative Example 2 | 130 | 5 | 320 | 8% | 100 | 94 | 86 | 72 |
| Comparative Example 3 | 140 | 15 | 325 | 3% | 100 | 92 | 80 | 64 |
| Comparative Example 4 | 130 | 8 | 305 | 1% | 100 | 94 | 82 | 70 |
| Comparative Example 5 | 120 | 12 | 290 | 2% | 100 | 88 | 76 | 50 |
| Comparative Example 6 | 120 | 6 | 325 | 10% | 100 | 94 | 84 | 70 |
| Comparative Example 7 | 120 | 8 | 300 | 1% | 100 | 94 | 84 | 72 |
| Comparative Example 8 | 240 | 3 | 345 | 1% | 90 | 88 | 84 | 70 |

DESCRIPTION OF REFERENCE SIGNS

1: TFT (thin film transistor)
2: Wire
3: TFT insulation layer
4: Planarization layer
5: ITO (transparent electrode)
6: Substrate
7: Contact hole
8: Insulation layer
9: Silicon wafer
10: Al pad
11: Passivation layer
12: Insulation layer
13: Metal (Cr, Ti etc.) layer
14: Metal wire (Al, Cu etc.)
15: Insulation layer
16: Barrier metal
17: Scribe line
18: Solder bump
19: Non-alkali glass substrate
20: First electrode (transparent electrode)
21: Auxiliary electrode
22: Insulation layer
23: Organic EL layer
131
24: Second electrode (non-transparent electrode)

The invention claimed is:

1. A resin composition comprising:
(i) an alkali-soluble resin (a) comprising polyimide, polybenzoxazole, polyamide-imide, a precursor of any one of these compounds and/or a copolymer of these compounds; and
(ii) an alkali-soluble resin (b) comprising an alkali-soluble resin (b1) and/or an alkali-soluble resin (b2), wherein alkali-soluble resins (1) and (b2) have unmodified structural units of phenolic hydroxyl groups and modified structural units of modified phenolic hydroxyl groups,
wherein the modified structural units are present in a proportion of 5 mol % to 50 mol %, the modified structural units of alkali-soluble resin (b1) are represented by formula (2), and the modified structural units of alkali-soluble resin (b2) are represented by formula (3) below,

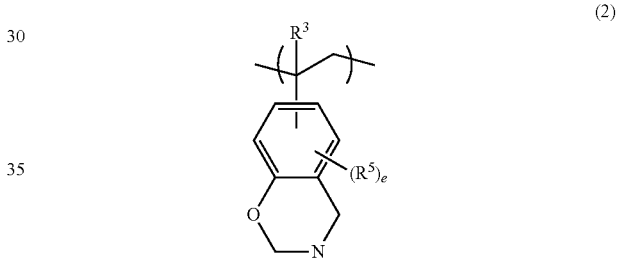

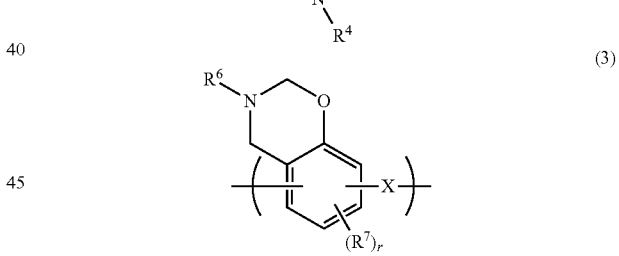

wherein in formula (2),
R³ represents a hydrogen atom or an alkyl group having 1 to 5 carbon atoms,
R⁴ represents a hydrocarbon group which has 1 to 20 carbon atoms and may be substituted,
R⁵ represents an alkyl group having 1 to 5 carbon atoms, and
e represents an integer from 0 to 3; and
wherein in formula (3),
X represents —CH₂—, —CH₂OCH₂— or a divalent aromatic group,
R⁶ represents a hydrocarbon group which has 1 to 20 carbon atoms and may be substituted,
R⁷ represents an alkyl group having 1 to 5 carbon atoms, and
f represents an integer from 0 to 2; and
wherein the amount of alkali-soluble resin (b) is 5 to 300 parts by mass with respect to 100 parts by mass of alkali-soluble resin (a).

2. The resin composition according to claim 1, wherein the alkali-soluble resin (b1) further comprises modified structural units represented by formula (4) and/or modified structural units represented by formula (5)

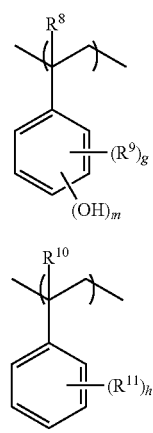

(4)

(5)

wherein in formula (4),
$R^8$ represents a hydrogen atom or an alkyl group having 1 to 5 carbon atoms,
$R^9$ represents an alkyl group having 1 to 5 carbon atoms,
m represents an integer from 1 to 5, and
g represents an integer from 0 to 4; and
wherein in formula (5),
$R^{10}$ represents a hydrogen atom or an alkyl group having 1 to 5 carbon atoms,
$R_{11}$ represents an alkyl group having 1 to 5 carbon atoms,
h represents an integer from 0 to 5.

3. The resin composition according to claim 1, wherein the alkali-soluble resin (b2) further comprises modified structural units represented by formula (6)

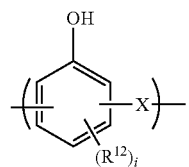

(6)

wherein in formula (6),
X represents —$CH_2$—, —$CH_2OCH_2$— or a divalent aromatic group,
$R^{12}$ represents an alkyl group having 1 to 5 carbon atoms, and
i represents an integer from 0 to 3.

4. The resin composition according to claim 1, wherein of the modified structural units in the alkali-soluble resin (b1) and the alkali-soluble resin (b2) are present in a proportion of 5 mol % to 25 mol %.

5. The resin composition according to claim 1, wherein the alkali-soluble resin (a) comprises polyimide precursor and/or polybenzoxazole precursor.

6. The resin composition according to claim 1, further comprising (c) a photosensitive compound.

7. The resin composition according to claim 6, wherein the photosensitive compound (c) contains a quinone diazide compound.

8. The resin composition according to claim 1, further comprising (d) a colorant.

9. The resin composition according to claim 1, further comprising (e1) an amido-phenol compound having a monovalent group represented by formula (7) at an ortho position of a phenolic hydroxyl group and/or (e2) an aromatic amic acid compound having a monovalent group represented by formula (8) at an ortho position of a carboxy group

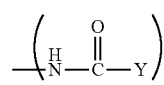

(7)

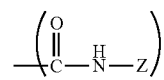

(8)

wherein in formula (7),
Y represents a monovalent organic group having an alkyl group which has 2 to 20 carbon atoms and is directly bonded to the carbonyl carbon in formula (7) or a monovalent organic group —$(WO)_n$— wherein W represents an alkylene group having 1 to 10 carbon atoms, and n represents an integer from 1 to 20; and
wherein in formula (8),
Z represents a monovalent organic group having an alkyl group which has 2 to 20 carbon atoms and is directly bonded to the amide nitrogen in formula (8) or a monovalent organic group —$(WO)_n$— wherein W represents an alkylene group having 1 to 10 carbon atoms, and n represents an integer from 1 to 20.

10. A resin sheet formed from the resin composition according to claim 1.

11. A cured film obtained by curing the resin sheet according to claim 10.

12. A cured film obtained by curing the resin composition according to claim 1.

13. An organic EL display device comprising a driving circuit, a planarization layer, a first electrode, an insulation layer, a light-emitting layer, and a second electrode on a substrate, wherein the planarization layer and/or the insulation layer includes the cured film according to claim 11.

14. The organic EL display device according to claim 13, wherein a thickness of the planarization layer is 1.0 to 5.0 µm.

15. The organic EL display device according to claim 13, wherein the planarization layer includes a plurality of layers.

16. A semiconductor electronic component or a semiconductor equipment comprising an electrode, a metal wire, an interlayer insulation layer and/or a surface protective layer on a substrate, wherein the interlayer insulation layer and/or the surface protective layer of the semiconductor electronic component includes the cured film according to claim 11.

17. A semiconductor electronic component or a semiconductor equipment comprising an electrode, a metal wire, an interlayer insulation layer and/or a surface protective layer on a substrate, wherein the interlayer insulation layer and/or the surface protective layer of the semiconductor equipment includes the cured film according to claim 11.

18. A method for producing an organic EL display device, the method comprising:
a step of forming a photosensitive resin film including the resin composition according to claim 6 on a substrate;
a step of exposing the photosensitive resin film to light;

a step of developing the photosensitive resin film exposed to light; and a step of subjecting the photosensitive resin film developed to a heat treatment.

19. The resin composition according to claim 1, wherein the amount of alkali-soluble resin (b) is 5 to 200 parts by mass with respect to 100 parts by mass of alkali-soluble resin (a).

20. The resin composition according to claim 1, wherein the amount of alkali-soluble resin (b) is 20 to 200 parts by mass with respect to 100 parts by mass of alkali-soluble resin (a).

* * * * *